(12) United States Patent
Yin et al.

(10) Patent No.: US 12,300,937 B2
(45) Date of Patent: *May 13, 2025

(54) HIGH SPEED ELECTRICAL CONNECTOR

(71) Applicant: Amphenol Commercial Products (Chengdu) Co., Ltd., Chengdu (CN)

(72) Inventors: Wenfeng Yin, Chengdu (CN); Teng Cao, Chengdu (CN); Xiaodong Hu, Chengdu (CN); Lei Liao, Shenzhen (CN); Xiang Wang, Shenzhen (CN); Yan-Bin Tan, Shenzhen (CN); Wei Luo, Shenzhen (CN); Jing-Tang Zhou, Shenzhen (CN)

(73) Assignee: Amphenol Commercial Products (Chengdu) Co., Ltd., Chengdu (CN)

(*) Notice: Subject to any disclaimer, the term of this patent is extended or adjusted under 35 U.S.C. 154(b) by 352 days.

This patent is subject to a terminal disclaimer.

(21) Appl. No.: 17/874,814

(22) Filed: Jul. 27, 2022

(65) Prior Publication Data
US 2023/0050934 A1 Feb. 16, 2023

(30) Foreign Application Priority Data

Aug. 13, 2021 (CN) .......................... 202121892308.3
Jul. 8, 2022 (CN) .......................... 202210805418.4
Jul. 8, 2022 (CN) .......................... 202221760539.3

(51) Int. Cl.
*H01R 13/6471* (2011.01)
*H01R 12/57* (2011.01)
(Continued)

(52) U.S. Cl.
CPC ......... *H01R 13/6471* (2013.01); *H01R 12/57* (2013.01); *H01R 12/716* (2013.01);
(Continued)

(58) Field of Classification Search
CPC ............ H01R 1313/6471; H01R 12/57; H01R 12/716; H01R 13/502; H01R 13/6588;
(Continued)

(56) References Cited

U.S. PATENT DOCUMENTS 7,335,063 B2    2/2008  Cohen et al.
7,581,990 B2    9/2009  Kirk et al.
(Continued)

FOREIGN PATENT DOCUMENTS

CN    202585857 U    12/2012
CN    203205638 U     9/2013
(Continued)

OTHER PUBLICATIONS

[No Author Listed], SFF-TA-1001 Specification for Universal x4 Link Definition for SFF-8639. Rev 1.1. SNIA Advance storage & information technology. May 28, 2018. 20 pages.
(Continued)

*Primary Examiner* — Travis S Chambers
(74) *Attorney, Agent, or Firm* — Wolf, Greenfield & Sacks, P.C.

(57) ABSTRACT

A connector for use with high-speed signals. The connector may include a row of conductive elements comprising signal conductors and ground conductors. A signal conductor may include a mating end, a mounting end opposite the mating end, and an intermediate portion extending therebetween. A ground conductor may include a shell at least partially encircling intermediate portions of a group of signal conductors, with openings that expose contact surfaces of the signal conductors at the ends. The ground conductors may include contact members aligned with the mating contact surfaces of the signal conductors. Each shell may be coupled to a ground mounting location on each side of a respective group of signal conductors, with adjacent shells sharing a
(Continued)

ground mounting location. Such a configuration may meet signal integrity requirements in connectors designed for 64 Gbps and beyond, while conforming to a standard that constrains mating and mounting interfaces.

20 Claims, 15 Drawing Sheets

(51) Int. Cl.
    *H01R 12/71*     (2011.01)
    *H01R 13/502*     (2006.01)
    *H05K 1/11*     (2006.01)
    *H05K 1/18*     (2006.01)

(52) U.S. Cl.
    CPC ........... *H01R 13/502* (2013.01); *H05K 1/111* (2013.01); *H05K 1/181* (2013.01); *H05K 2201/10189* (2013.01)

(58) Field of Classification Search
    CPC .. H01R 13/6594; H01R 13/6597; H05K 1/11; H05K 1/181; H05K 2201/10189
    See application file for complete search history.

(56) References Cited

U.S. PATENT DOCUMENTS

| | | |
|---|---|---|
| 8,462,502 B2 | 6/2013 | Hirano et al. |
| 8,585,440 B2 | 11/2013 | Jiang et al. |
| 8,702,451 B2 | 4/2014 | Luo et al. |
| 8,740,631 B2 | 6/2014 | Chen |
| 9,225,090 B2 | 12/2015 | Chen |
| 9,407,022 B1 | 8/2016 | Wang |
| 9,564,714 B1 | 2/2017 | Wang et al. |
| 9,941,641 B1 | 4/2018 | Jiang et al. |
| 9,985,391 B1 | 5/2018 | Wang |
| 10,283,910 B1 | 5/2019 | Chen et al. |
| 10,411,376 B1 | 9/2019 | Wang et al. |
| 10,651,589 B1 | 5/2020 | Wang et al. |
| 10,763,608 B1 | 9/2020 | Wang et al. |
| 11,251,554 B1 | 2/2022 | Tan et al. |
| 2007/0111596 A1* | 5/2007 | Weidner ............... H01R 9/0515 439/581 |
| 2014/0211389 A1 | 7/2014 | Zhou et al. |
| 2017/0194754 A1* | 7/2017 | Tsai ....................... H01R 24/60 |
| 2018/0205181 A1 | 7/2018 | Chen et al. |
| 2019/0214753 A1 | 7/2019 | Jiang et al. |
| 2020/0028289 A1 | 1/2020 | Dai et al. |
| 2021/0399455 A1 | 12/2021 | Wang et al. |
| 2022/0077614 A1 | 3/2022 | Tan et al. |
| 2022/0302655 A1 | 9/2022 | Wang et al. |
| 2022/0360000 A1 | 11/2022 | Tan et al. |
| 2023/0047671 A1* | 2/2023 | Wang ................. H01R 13/6581 |
| 2024/0072494 A1* | 2/2024 | He ....................... H01R 12/721 |

FOREIGN PATENT DOCUMENTS

| | | |
|---|---|---|
| CN | 203850501 U | 9/2014 |
| CN | 104283080 A | 1/2015 |
| CN | 204376132 U | 6/2015 |
| CN | 205016785 U | 2/2016 |
| CN | 103887641 B | 6/2016 |
| CN | 205944534 U | 2/2017 |
| CN | 206962152 U | 2/2018 |
| CN | 207116835 U | 3/2018 |
| CN | 207183588 U | 4/2018 |
| CN | 207338696 U | 5/2018 |
| CN | 207517943 U | 6/2018 |
| CN | 109004437 A | 12/2018 |
| CN | 208284706 U | 12/2018 |
| CN | 208433570 U | 1/2019 |
| CN | 209675519 U | 11/2019 |
| CN | 212380677 U | 1/2021 |
| CN | 215816686 U | 2/2022 |
| TW | I505580 B | 10/2015 |
| TW | I509921 B | 11/2015 |
| TW | M546036 U | 7/2017 |
| TW | M563682 U | 7/2018 |
| TW | M573906 U | 2/2019 |
| TW | M584561 U | 10/2019 |
| TW | M606366 U | 1/2021 |
| TW | M618868 U | 11/2021 |
| TW | M621514 U | 12/2021 |
| WO | WO-2020020291 A1 * | 1/2020 ........... H01R 12/716 |

OTHER PUBLICATIONS

Mason et al., SAS Standards and Technology Update. Storage Developer Conference (SDC). 2011. 46 pages. URL:https://www.snia.org/sites/default/orig/SDC2011/presentations/monday/HarryMason_SAS%20_Standards_Technology_Updater1.pdf [last accessed Jun. 2, 2022].

[No Author Listed], Card Edge Connector for PCI Express Applications. Tyco Electronics Corporation. 2008. 5 pages.

[No Author Listed], PCI Express Card Edge Connector Straddle Mount Type. TE Connectivity Ltd. Jan. 2018. 4 pages.

[No Author Listed], SFF Committee SFF-8639 Specification for Multifunction 6X Unshielded Connector. Rev 2.1. Development. SNIA SFF TWG Technology Affiliate. May 26, 2017. 32 pages.

Liu et al., Card Edge Connector, U.S. Appl. No. 17/871,114, filed Jul. 22, 2022.

Tan et al., PSAS 5.0 Female Connector, U.S. Appl. No. 18/084,454, filed Dec. 19, 2022.

Wang et al., PCIE/SAS Connector Structure, U.S. Appl. No. 17/476,002, filed Sep. 15, 2021.

Wang et al., PCIE/SAS Female Connector, U.S. Appl. No. 18/076,066, filed Dec. 6, 2022.

Yin et al.l., High Speed Plug Connector, U.S. Appl. No. 17/848,851, filed Jun. 24, 2022.

* cited by examiner

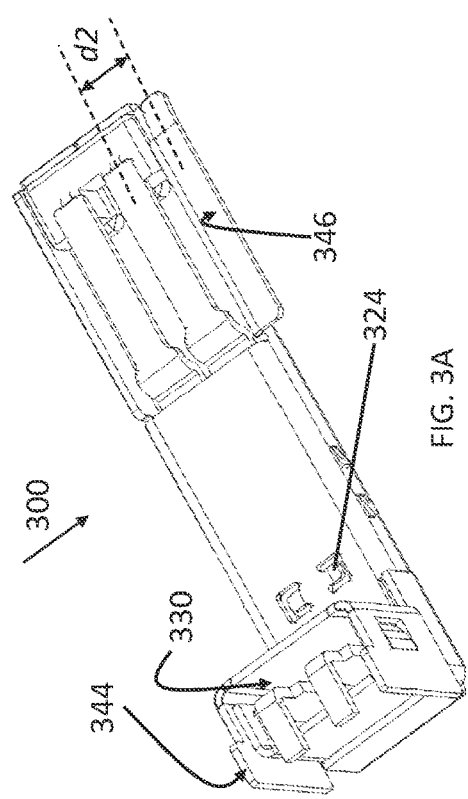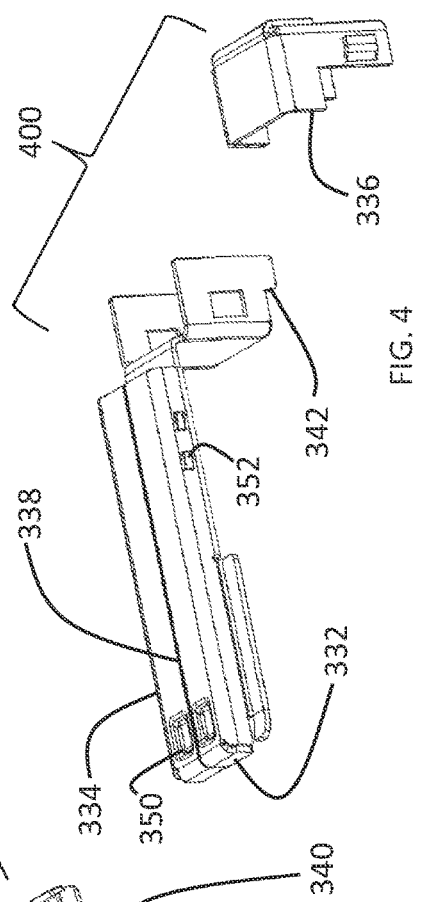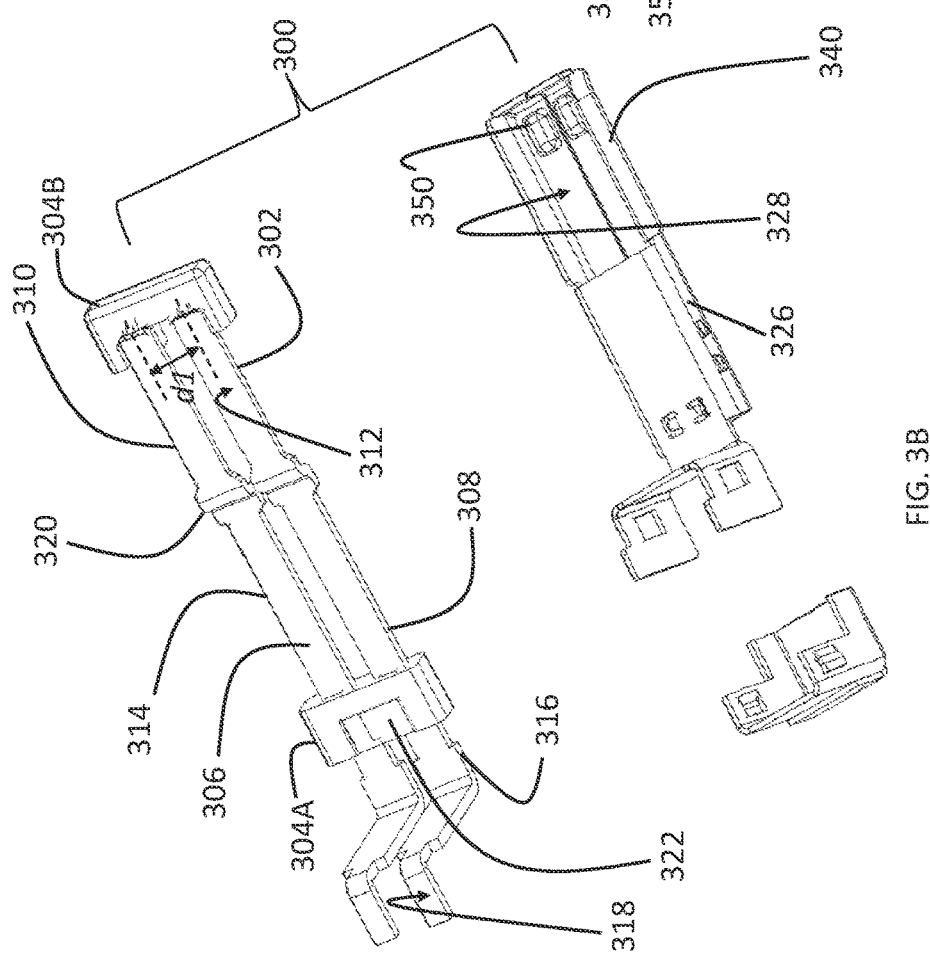

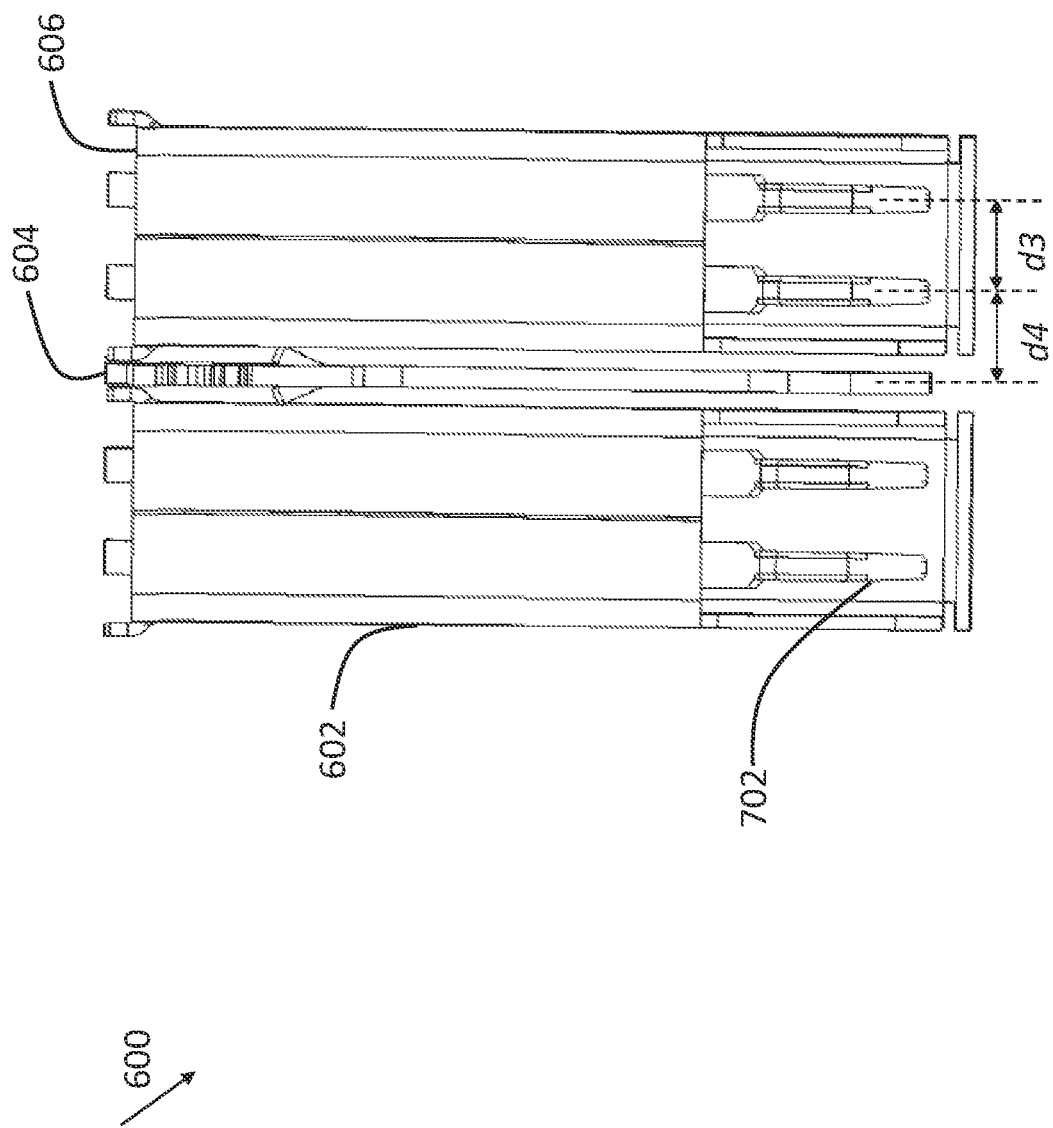

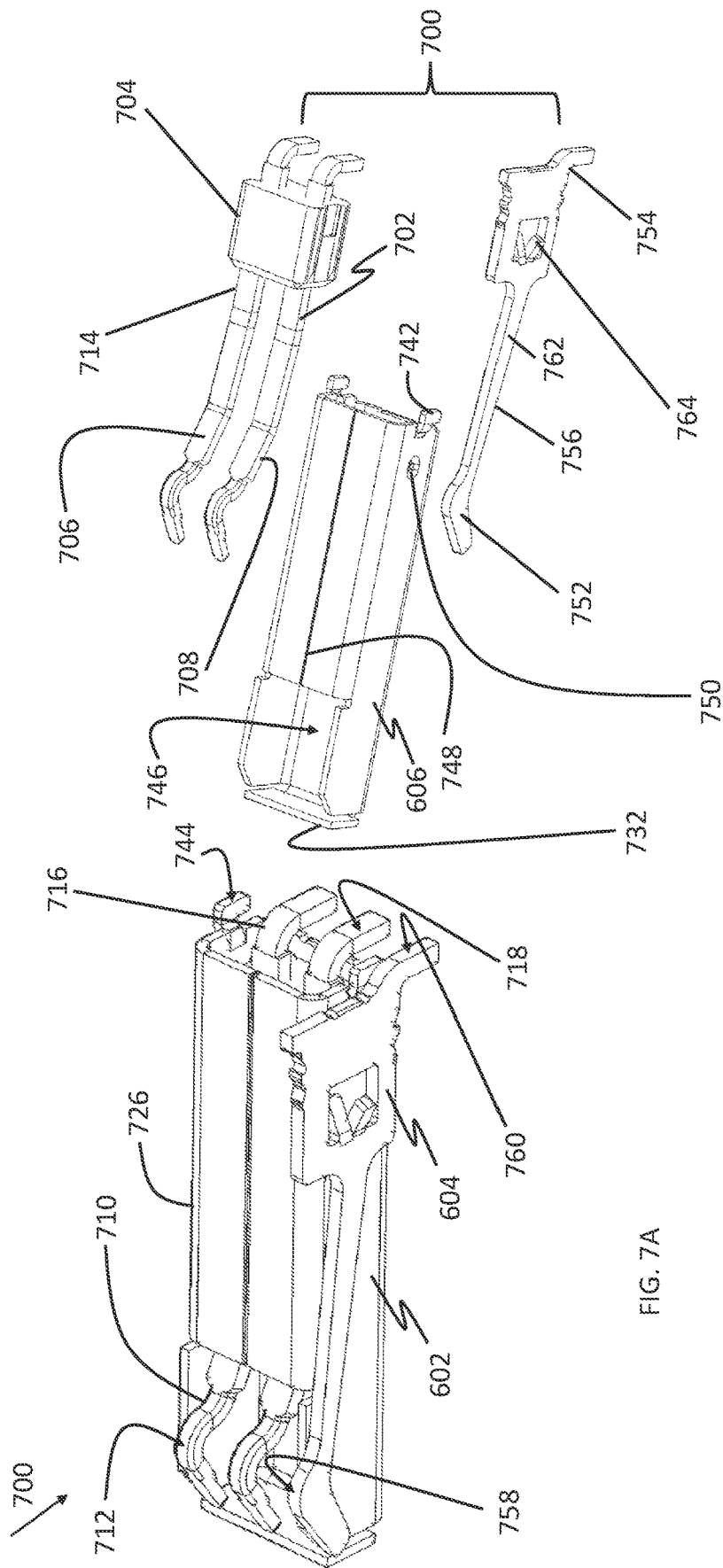

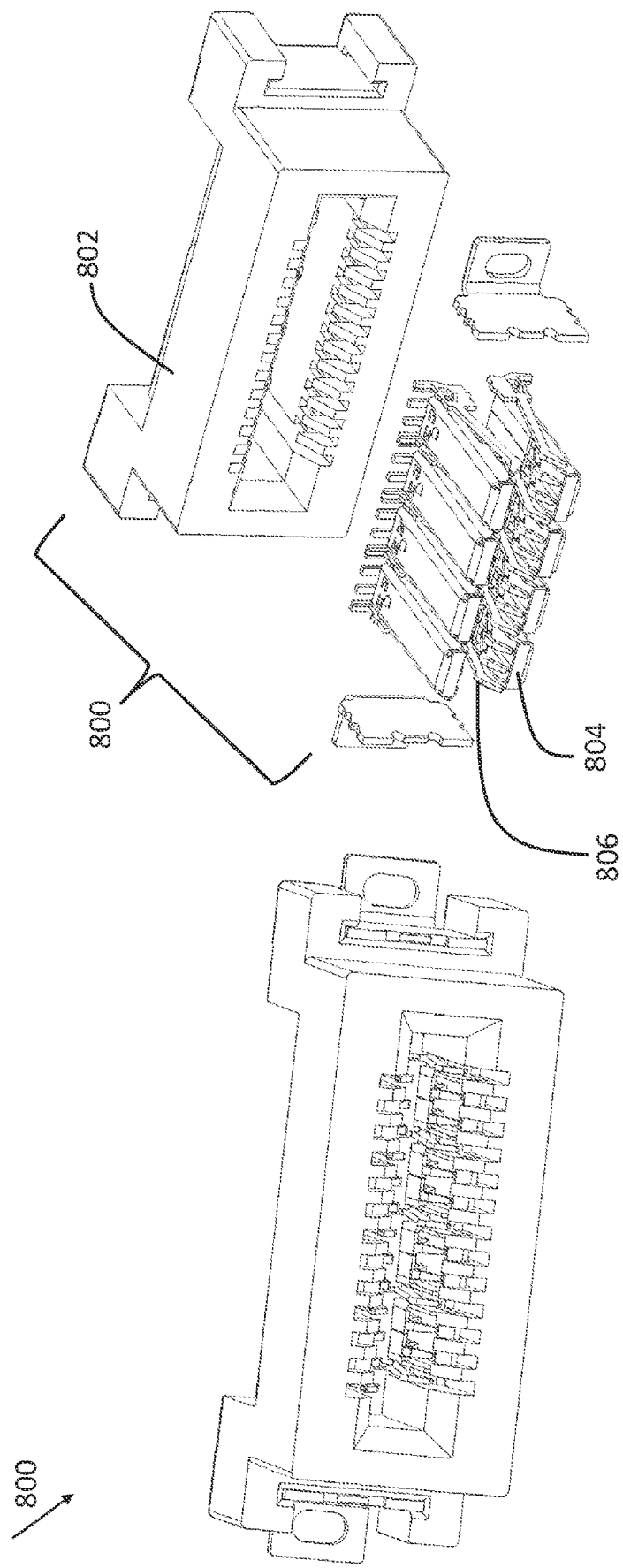

HIGH SPEED ELECTRICAL CONNECTOR

RELATED APPLICATIONS

This application claims priority to and the benefit of Chinese Patent Application Serial No. 202121892308.3, filed on Aug. 13, 2021. This application also claims priority to and the benefit of Chinese Patent Application Serial No. 202210805418.4, filed on Jul. 8, 2022. This application also claims priority to and the benefit of Chinese Patent Application Serial No. 202221760539.3, filed on Jul. 8, 2022. The entire contents of these applications are incorporated herein by reference in their entirety.

FIELD

This application relates generally to electrical connectors, such as those used to interconnect electronic assemblies.

BACKGROUND

Electrical connectors are used in many electronic systems. It is generally easier and more cost effective to manufacture a system as separate electronic subassemblies, such as printed circuit boards (PCBs), which may be joined together with electrical connectors. Having separable connectors enables components of the electronic system manufactured by different manufacturers to be readily assembled. Separable connectors also enable components to be readily replaced after the system is assembled, either to replace defective components or to upgrade the system with higher performance components.

A known arrangement for joining several printed circuit boards is to have one printed circuit board serve as a backplane. A known backplane is a PCB onto which many connectors may be mounted. Conducting traces in the backplane may be electrically connected to signal conductors in the connectors so that signals may be routed between the connectors. Other printed circuit boards, called "daughterboards," "daughtercards," or "midboards," may be connected through the backplane. For example, daughtercards may also have connectors mounted thereon. The connectors mounted on a daughtercard may be plugged into the connectors mounted on the backplane. In this way, signals may be routed among daughtercards through the connectors and the backplane. The daughtercards may plug into the backplane at a right angle. The connectors used for these applications may therefore include a right angle bend and are often called "right angle connectors."

Connectors may also be used in other configurations for interconnecting printed circuit boards. Sometimes, one or more printed circuit boards may be connected to another printed circuit board, called a "motherboard," that is both populated with electronic components and interconnects the daughterboards. In such a configuration, the printed circuit boards connected to the motherboard may be called daughterboards. The daughterboards are often smaller than the motherboard and may sometimes be aligned parallel to the motherboard. Connectors used for this configuration are often called "stacking connectors" or "mezzanine connectors." In other systems, the daughterboards may be perpendicular to the motherboard.

For example, this configuration is often used in computers in which the motherboard might have a processor and a bus configured to pass data between the processor and peripherals, such as a graphics processor or memory. Connectors may be mounted to the motherboard and connected to the bus. The peripherals may be implemented on daughtercards with connectors that mate with the connectors on the bus such that separately manufactured peripherals may be readily integrated into a computer made with the motherboard.

To enhance the availability of peripherals, the bus and the connectors used to physically connect peripherals via the bus may be standardized. In this way, there may be a large number of peripherals available from a multitude of manufacturers. All of those products, so long as they are compliant with the standard, may be used in a computer that has a bus compliant with the standard. Examples of such standards include serial ATA (SATA), serial attached SCSI (SAS), and peripheral component interconnect express (PCIe), which are commonly used in computers. The standards have gone through multiple revisions, adapting to the higher performance expected from computers over time.

BRIEF SUMMARY

Aspects of the present disclosure relate to high speed electrical connectors.

Some embodiments relate to an electrical connector. The electrical connector may comprise a housing; a plurality of signal conductors coupled to the housing and disposed in a plurality of groups of signal conductors, each of the signal conductors comprising a mating end, a mounting end and an intermediate portion joining the mating end and the mounting end, wherein the mating ends of the plurality of signal conductors may be disposed in a row; and a plurality of ground conductors associated with respective groups of the plurality of groups of signal conductors, each of the plurality of ground conductors comprising a shell and a contact member. For each of the plurality of ground conductors, the shell may comprise a first opening and a second opening, the contact member may comprise a mating end, the intermediate portions of the signal conductors of the respective group of signal conductors may be disposed within the shell such that the mating ends are exposed through the first opening and the mounting ends are exposed through the second opening, and the mating end of the contact member may be disposed within the row of mating ends of the plurality of signal conductors.

In some embodiments, the shell may comprise at least one metal sheet with a first edge and a second edge, and the metal sheet may be folded such that the first edge and the second edge face each other.

In some embodiments, the first edge and the second edge may be joined at a weld.

In some embodiments, the shell may comprise a mating end adjacent the mating ends of the respective group of signal conductors. The mating end of the shell may comprise a plurality of side portions surrounding the mating ends of the respective group of signal conductors on three sides and an end portion orthogonal to the plurality of side portions. The first opening of the shell may be through a side of the shell that is orthogonal to the end portion.

In some embodiments, the shell may comprise a metal component. The contact member may be integral with the metal component.

In some embodiments, the mating end of the contact member and the mating ends of the plurality of signal conductors are blades.

In some embodiments, the electrical connector may be a plug.

In some embodiments, the housing may comprise a wall with a first side and a second side. Blades may be exposed through openings in the first side of the wall.

In some embodiments, the contact member may be formed separately from the shell.

In some embodiments, the mating end of the contact member and the mating ends of the plurality of signal conductors may be compliant beams.

In some embodiments, the electrical connector may be a receptacle.

In some embodiments, the housing may comprise a slot with a first side and a second side. Mating contact surfaces on the beams may line with the first side of the slot.

Some embodiments relate to an electrical connector. The electrical connector may comprise a housing; a plurality of signal conductors coupled to the housing and disposed in a plurality of groups of signal conductors, each of the signal conductors comprising a mating end, a mounting end and an intermediate portion joining the mating end and the mounting end, wherein the mounting ends of the plurality of signal conductors may be disposed in a row; a plurality of ground conductors associated with respective groups of the plurality of groups of signal conductors, each of the plurality of ground conductors comprising a shell and a contact member. For each of the plurality of ground conductors, the shell may comprise a first opening and a second opening, the intermediate portions of the signal conductors of the respective group of signal conductors may be disposed within the shell such that the mating ends are exposed through the first opening and the mounting ends are exposed through the second opening, and the plurality of ground conductors may comprise a plurality of mounting members disposed in the row such that a mounting member of a ground conductor may be disposed adjacent to and on each side of the mounting ends of the signal conductors of each of the plurality of groups.

In some embodiments, the mounting ends of the signal conductors of each of the plurality of groups may have a center-to-center separation of a first distance. The mounting members of the ground conductors may have a center-to-center separation with respect to adjacent mounting ends of the signal conductors of the first distance. Mounting members of the plurality of ground conductors disposed between and adjacent to two of the plurality of groups may be electrically coupled to the shells of the respective ground conductors of the two groups.

In some embodiments, the plurality of mounting members of the plurality of ground conductors may comprise mounting tabs integral with the shells of the ground conductors.

In some embodiments, the plurality of ground conductors may each comprise a contact member electrically coupled to the shell. Each of the plurality of mounting members of the plurality of ground conductors may comprise a mounting tab integral with a contact member of a ground conductor.

In some embodiments, the mounting ends of the plurality of signal conductors and the mounting members of the plurality of ground conductors may be disposed in a linear array. The linear array may comprise a repeating pattern of one mounting member of a ground conductor followed by two mounting ends of signal conductors; and one mounting member of a ground conductor following the repeating pattern.

Some embodiments may relate to an electronic system. The electronic system may include a printed circuit board; and the electrical connector according to some embodiments mounted to the printed circuit board. The printed circuit board may comprise a surface with a linear array of contact pads on the surface, the linear array of contact pads comprising a repeating pattern of one ground pad followed by two differential signal pads, and a ground pad following the repeating pattern. The linear array of the electrical connector may be aligned with the linear array of the printed circuit board. The mounting ends of the plurality of signal conductors and the mounting members of the plurality of ground conductors in the linear array of the electrical connector may be soldered to respective pads in the linear array of the printed circuit board.

In some embodiments, the linear array of contact pads may be configured in compliance with specification SFF-8639.

In some embodiments, the electrical system may be configured to pass data through the electrical connector at a rate of at least 64 Gbps.

Some embodiments relate to an electrical connector subassembly. The electrical connector subassembly may comprise at least one signal conductor, the at least one signal conductor each comprising a mating end comprising a mating contact surface, a mounting end opposite the mating end and comprising a mounting contact surface, and an intermediate portion extending between the mating end and the mounting end; a housing member holding a portion of the intermediate portion of the at least one signal conductor; and a ground conductor surrounding the intermediate portion of the at least one signal conductor, the ground conductor comprising a mounting contact surface disposed in a same plane with the mounting contact surface of the at least one signal conductor.

In some embodiments, the ground conductor may comprise a weld extending along the intermediate portion of the at least one signal conductor.

In some embodiments, the ground conductor may extend to the mating end of the at least one signal conductor, and comprise an opening that exposes the mating contact surface of the at least one signal conductor.

In some embodiments, the ground conductor may comprise a front piece at a side of the opening.

In some embodiments, for the at least one signal conductor, the mating contact surface may be parallel to or perpendicular to the mounting contact surface.

In some embodiments, the ground conductor may comprise a shell and a contact member. The contact member may comprise a mating end comprising a mating contact surface parallel to the mating contact surface of the at least one signal conductor, a mounting end opposite the mating end and comprising a mounting contact surface disposed in the same plane with the mounting contact surface of the at least one signal conductor, and an intermediate portion extending between the mating end and the mounting end.

In some embodiments, the intermediate portion of the contact member may comprise a protrusion contacting the shell.

In some embodiments, the mounting contact surface of the shell and the mounting contact surface of the contact member may be disposed such that the mounting contact surfaces of the shell and the contact member fit in one pad on a printed circuit board.

In some embodiments, for the at least one signal conductor, the mating contact surface may be parallel to the mounting contact surface.

In some embodiments, the weld may extend to the mating end of the at least one signal conductor.

In some embodiments, the ground conductor may comprise a contact bar extending from the opening.

In some embodiments, the housing member may comprise a first part that holds the portion of the intermediate portion of the at least one signal conductor, and a second part that holds a portion of the mating end of the at least one signal conductor.

In some embodiments, the ground conductor may comprise a first part that surrounds the intermediate portion of the at least one signal conductor, and a second part connected to the first part such that the first part and the second part together surround a portion of the mounting end of the at least one signal conductor.

In some embodiments, the at least one signal conductor may each comprise a transition region between the mating end and the intermediate portion such that the mating contact surface and a broadside of the intermediate portion extend along two planes that are offset from each other in a direction perpendicular to the broadside.

In some embodiments, the portions of the intermediate portion of the at least one signal conductor held by the housing member may be along less than 30% of the length of the at least one signal conductor.

Some embodiments relate to an electrical connector. The electrical connector may comprise a housing; a plurality of ground conductors held in a row by the housing; a plurality of conductive elements each comprising a mating end comprising a mating contact surface, a mounting end opposite the mating end and comprising a mounting contact surface, and an intermediate portion extending between the mating end and the mounting end; and a plurality of housing members each holding a portion of the intermediate portion of one or more of the plurality of conductive elements. The plurality of ground conductors may each surround one of the plurality of housing members.

In some embodiments, the plurality of housing members and the plurality of ground conductors may comprise matching features engaging each other such that the plurality of housing members are fixedly disposed inside the plurality of ground conductive elements.

In some embodiments, the plurality of housing members may be a plurality of first housing members. The electrical connector comprises a plurality of second housing members corresponding to the plurality of first housing members. The plurality of second housing members may each hold a portion of the mating end of the one or more conductive element held by a respective first housing member.

In some embodiments, the plurality of ground conductors may held by the housing in a first row. The plurality of conductive elements may comprise conductive elements held by the housing in a second row.

In some embodiments, the plurality of ground conductors may each comprise a mounting contact surface disposed in a same plane with the mounting contact surfaces of the plurality of conductive elements.

In some embodiments, the plurality of ground conductive elements may each comprise a shell surrounding one of the plurality of housing members and a contact member electrically connected to the shell, the contact member comprising a mating end comprising a mating contact surface, a mounting end opposite the mating end and comprising a mounting contact surface extending in a same plane with the mounting contact surfaces of the plurality of conductive elements, and an intermediate portion extending between the mating end and the mounting end.

In some embodiments, the contact members may be disposed such that broadsides of the contact members face edges of the plurality of conductive elements.

In some embodiments, the contact member may comprise a first protrusion contacting the intermediate portion of a first shell of a ground conductor, and a second protrusion protruding in a direction opposite to the first protrusion and contacting the intermediate portion of a second shell of a second ground conductor.

In some embodiments, the mounting contact surface of the contact member and a mounting contact surface of the shell may be disposed together such that they fit in one contact pad on a printed circuit board.

In some embodiments, the plurality of ground conductors may be a first plurality of ground conductors. The electrical connector may comprise a second plurality of ground conductors held by the housing in a different row from the first plurality of ground conductors.

In some embodiments, the plurality of ground conductors may each comprise a weld extending along the intermediate portion of the one or more conductive elements held by a respective housing member such that a gap is filled by the weld.

In some embodiments, the plurality of ground conductors may each extend to the mating end of the one or more conductive elements held by a respective housing member and comprise an opening that exposes the mating contact surface of the one or more conductive elements held by the respective housing member.

In some embodiments, the plurality of ground conductors may each comprise a front piece disposed beyond the mating end of the one or more conductive elements held by the respective housing member.

In some embodiments, the plurality of ground conductors may each comprise a contact bar extending from an edge of the opening towards an adjacent ground conductor and configured to make contact with a ground conductor of a mating connector.

In some embodiments, each of the plurality of ground conductors may comprise one or more dimples that align with the one or more of the plurality of conductive elements held by the respective housing member surrounded by the ground conductor.

Some embodiments relate to a method of manufacturing an electrical connector comprising a pair of conductive elements each comprising a mating end, a mounting end opposite the mating end, and an intermediate portion extending between the mating end and the mounting end. The method may comprise forming a shell by folding portions of a one-piece blank and welding a gap between two edges of the one-piece blank; molding a housing member over portions of the intermediate portions of the pair of conductive elements such that the pair of conductive elements are held in an edge-to-edge configuration and separate from each other by a fixed distance; and inserting the pair of conductive elements with the over-molded housing member into the shell.

In some embodiments, the pair of conductive elements with the over-molded housing member may be inserted into the shell when a feature of the shell engages a matching feature of the over-molded housing member.

In some embodiments, the method may comprise attaching a cover to the shell such that the shell and the cover together surround at least a portion of the mounting ends of the pair of conductive elements.

In some embodiments, the method may comprise providing a connector housing comprising a plurality of channels; and inserting the shell into a channel of the plurality of channels of the connector housing.

In some embodiments, the method may comprise providing a contact member comprising a mating end, a mounting end opposite the mating end, and an intermediate portion extending between the mating end and the mounting end and comprising a protrusion; and inserting the contact member to a second channel of the plurality of channels of the connector housing until the protrusion of the contact member engages a recess of the shell.

These techniques may be used alone or in any suitable combination. The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings:

FIG. 3A is a perspective view of a connector subassembly of the plug connector of FIG. 1A.

FIG. 3B is a partially exploded view of the connector subassembly of FIG. 3A.

FIG. 4 is a perspective view of a ground conductive element of the connector subassembly of FIG. 3A.

FIG. 6 is a top perspective view of connector subassemblies of the receptacle connector of FIG. 5A.

FIG. 7A is a perspective view of a connector subassembly of the receptacle connector of FIG. 5A.

FIG. 7B is a partially exploded view of the connector subassembly of FIG. 7A.

FIG. 8A is a perspective view of a card edge connector, according to some embodiments.

FIG. 8B is a partially exploded view of the card edge connector of FIG. 8A.

DETAILED DESCRIPTION

Figure 1A:
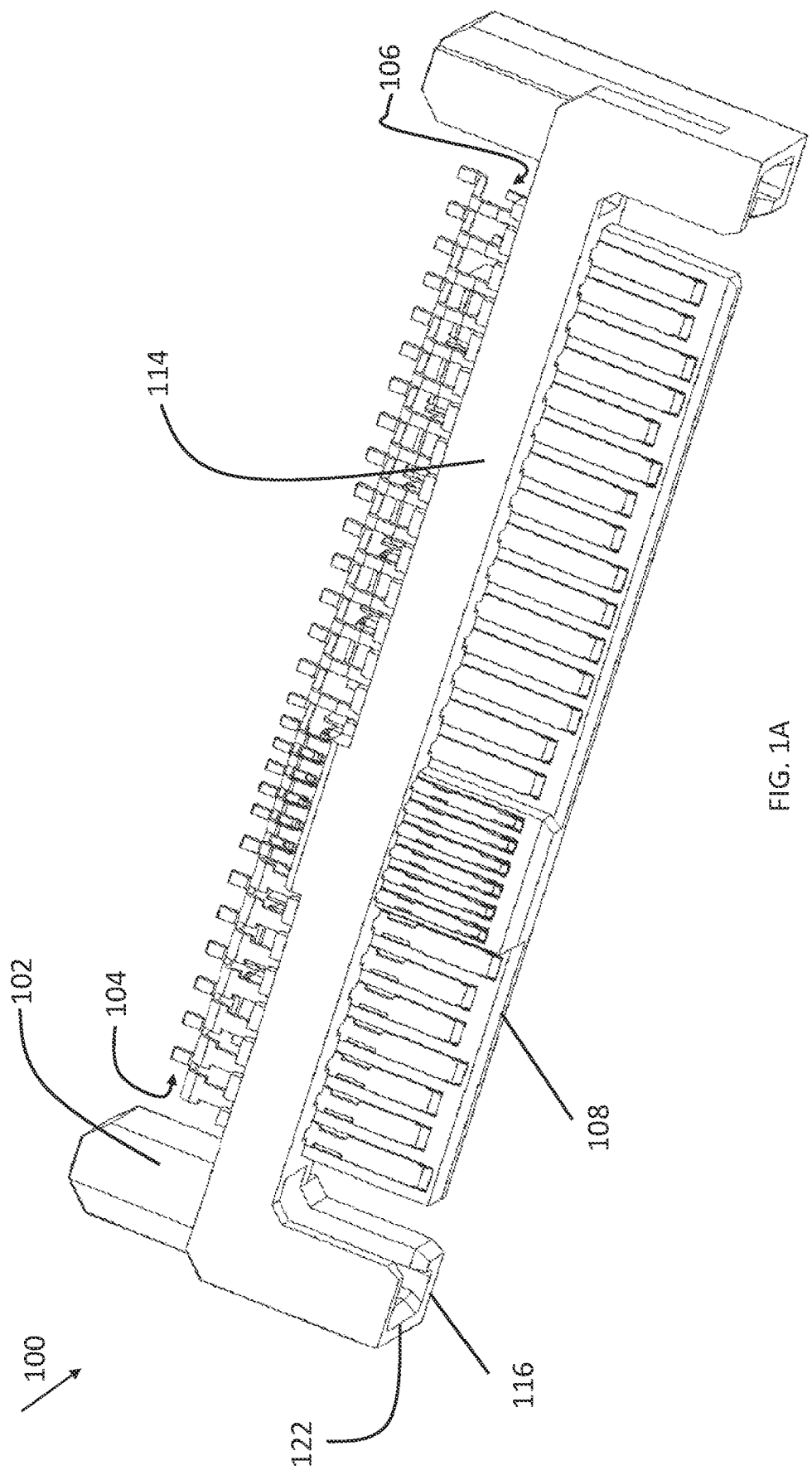
FIG. 1A is a perspective view of a plug connector, showing a top row of conductive elements, according to some embodiments.
Figure 1B:
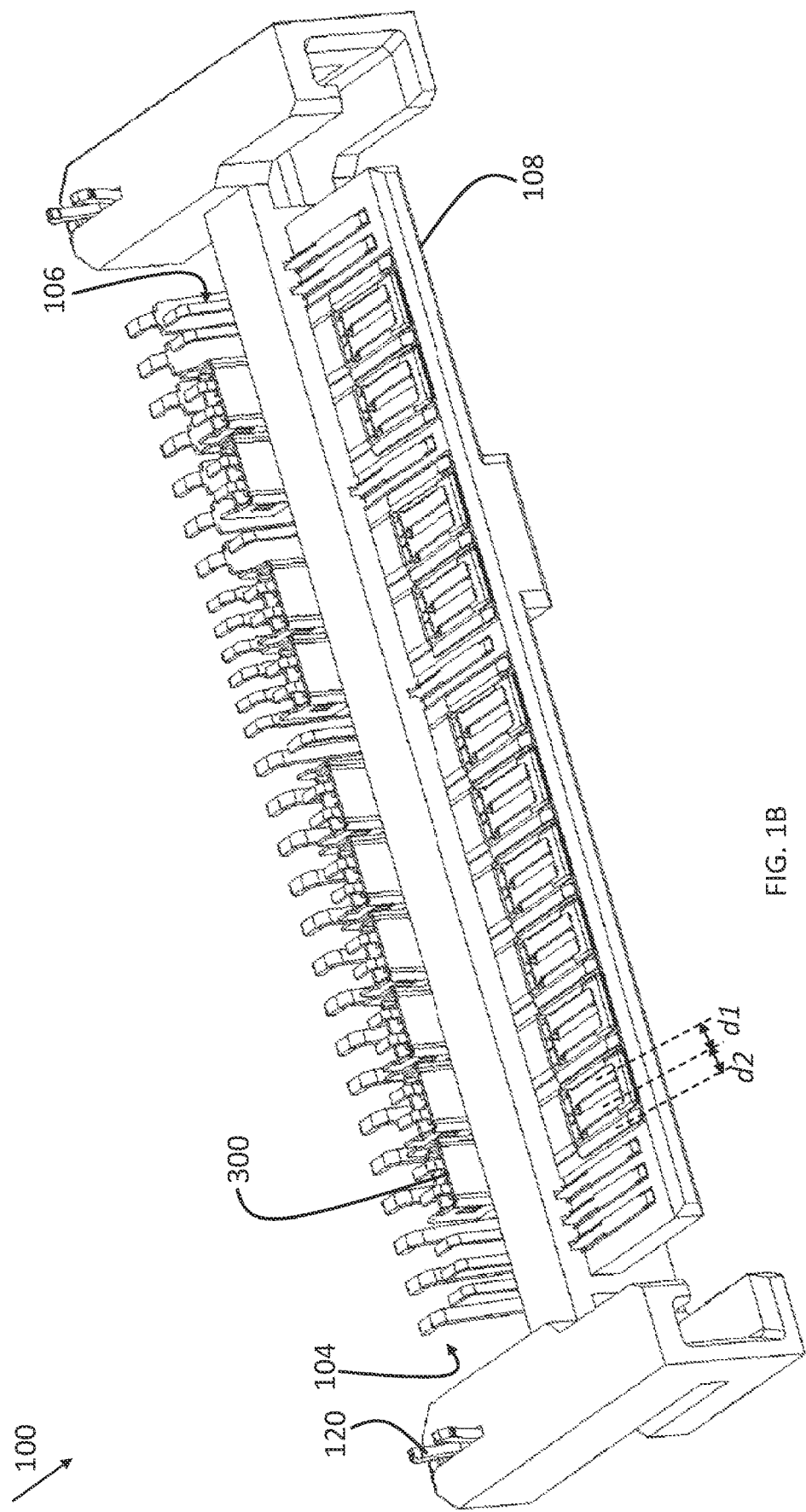
FIG. 1B is another perspective view of the plug connector of FIG. 1A, showing a bottom row of conductive elements.
Figure 1C:
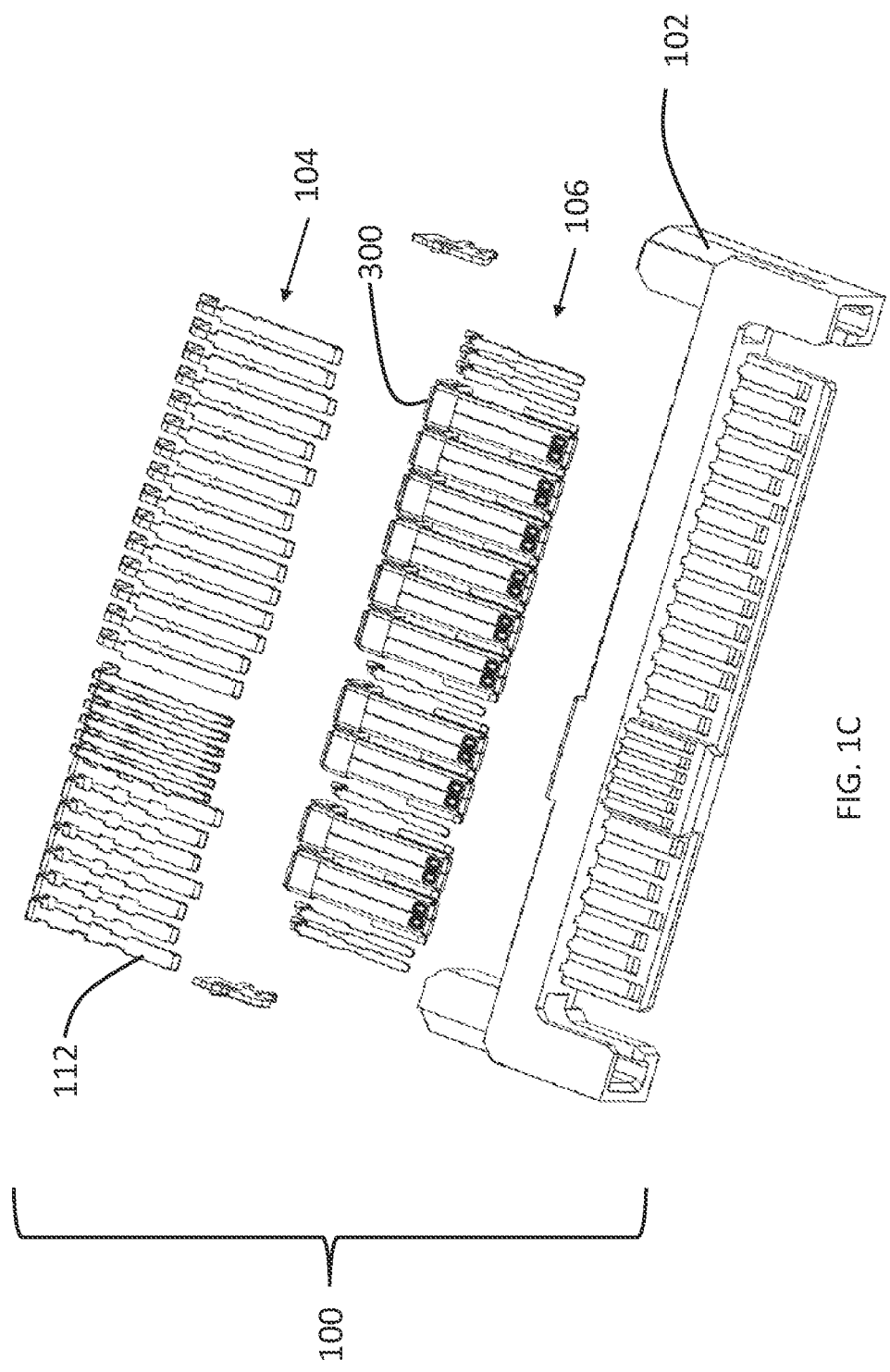
FIG. 1C is a partially exploded view of the plug connector of FIG. 1A.
Figure 1D:
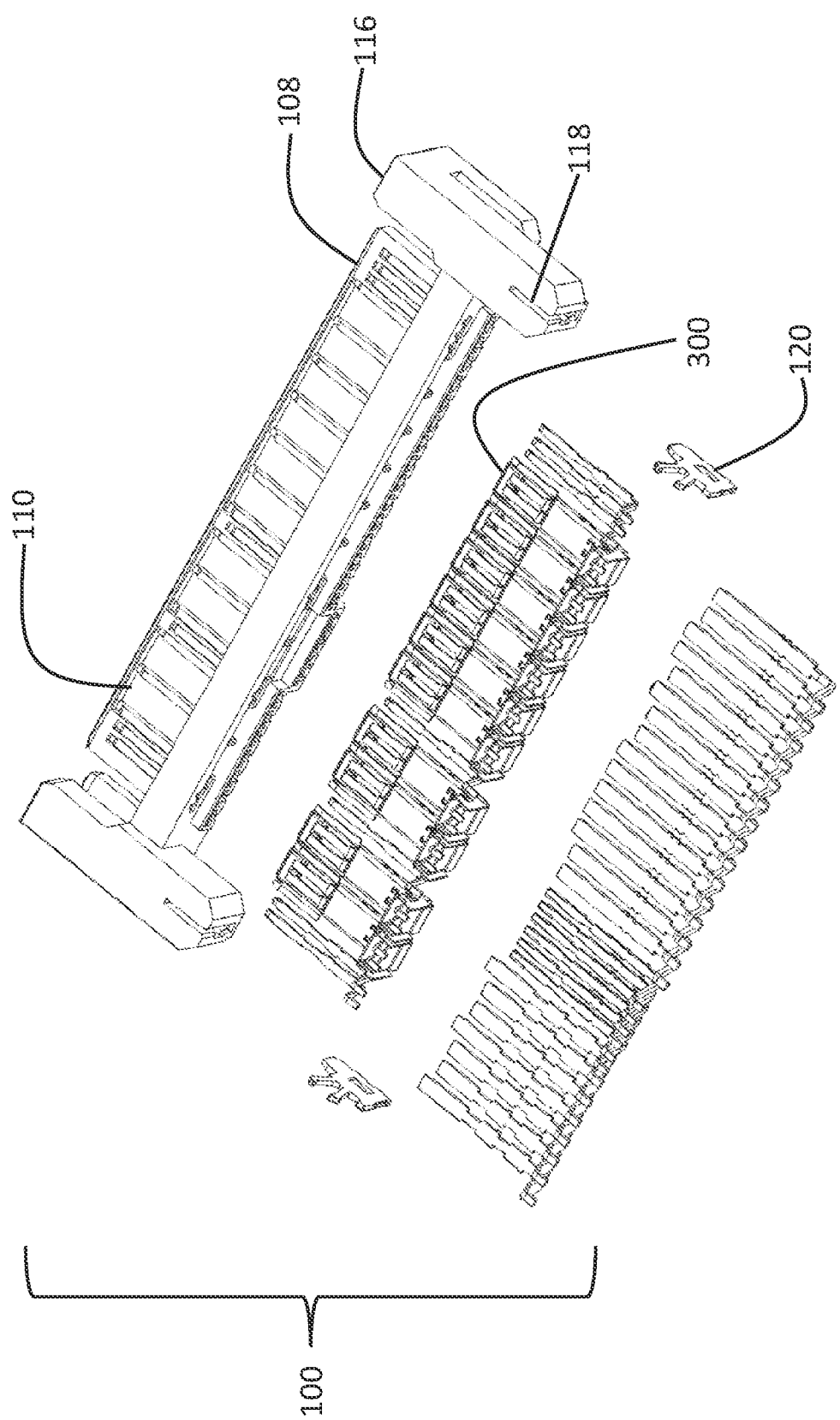
FIG. 1D is another partially exploded view of the plug connector of FIG. 1A.

The inventors have recognized and appreciated connector design techniques that satisfy electrical and mechanical requirements to support greater bandwidth through high frequency operation. Some of these techniques may synergistically support higher frequency connector operation while satisfying the physical requirements set by industry standards, including PCIeSAS. A connector satisfying the mechanical requirements of the PCIeSAS specification at the performance required for GEN 6 and beyond is used as an example of a connector in which these techniques have been applied.

An electrical connector may have one or more rows of conductive elements. Some of the conductive elements in a row may serve as high-speed signal conductors. Some of the conductive elements may serve as ground conductors referencing the high-speed signals. It should be appreciated that ground conductors need not to be connected to earth ground, but are shaped to carry reference potentials, which may include earth ground, DC voltages or other suitable reference potentials. Other conductive elements may serve as low-speed signal conductors or power conductors. Some of the low-speed signal conductors may also be designated as grounds, referencing the low-speed signals or providing a return path for those signals.

The high-speed and low-speed signal conductors may each have a mating end comprising a mating contact surface, configured for mating with a complementary mating contact surface of another electrical component, such as a printed circuit board or a complementary connector. Each signal conductor may also have a mounting end comprising a mounting contact surface, configured for mounting the connector to another electrical component, such as a printed circuit board or a cable. Each signal conductor may also have an intermediate portion, joining the mating end and the mounting end.

The high-speed signal conductors may be held in groups by housing members. A group may have one or more signal conductors. In some embodiments, each housing member may hold a group of signal conductors in an edge-to-edge configuration and separated from each other by a fixed distance. In some embodiments, the housing member may hold portions of the intermediate portions of the signal conductors of the group. The portions of the intermediate portions held by the housing member may be along less than 50% of the lengths of the high-speed signal conductors, and in some embodiments, less than 40%, 30%, 20% or 10% of the lengths of the signal conductors. This configuration may reduce impedance variation along the lengths of the signal conductors. In some embodiments, the housing member may be molded over at least a portion of each signal conductor in a group, thereby holding the group of signal conductors together. The groups may be held by a connector housing in one or more rows.

Ground conductors associated with groups of high-speed signal conductors may be configured to provide multi-dimensional shielding for the signal conductors that are in a group substantially along the lengths of the signal conductors. In some embodiments, for each group of signal conductors, a ground conductor may surround the intermediate portions of the signal conductors and extend from their mating ends to their mounting ends, with openings that expose contact surfaces at the mating and mounting ends. For example, a ground conductor may be formed from one or more metal sheets shaped as a tubular structure, with the signal conductors extending through a hollow interior of the tubular structure. The intermediate portions of the ground conductor may bound the intermediate portions of the signal conductors, on at least three sides. In the illustrated embodiments, the ground conductors bound the intermediate portions of the signal conductors on four sides. At the ends, the ground conductors may also bound the mating and mounting ends of the signal conductors on at least three sides. In the illustrated embodiment the ground conductors also bound the mating and mounting ends of the signal conductors on on four sides. On at least one side, the mating and mounting ends may be exposed through the ground conductor for mating to a complementary connector or mounting to a PCB.

The inventors have recognized and appreciated an efficient and repeatable process to manufacture the ground conductors. In some embodiments, the ground conductor may be formed by stamping a metal sheet into a one-piece blank. The one-piece blank may be folded into a shape that can substantially enclose a group of signal conductors. The inventors have also recognized and appreciated that one or more gaps may exist between edges of the one-piece blank, enabling crosstalk between, for example, signal conductors in different groups. The inventors have recognized and appreciated that filling the gaps by, for example, welding the edges enables the ground conductors to provide better shielding, which reduces the crosstalk and improves signal integrity, even at high transmission rates. In some embodiments, the weld may extend along the lengths of the intermediate portions of the group of signal conductors. The weld may be of any suitable length. For example, the weld may extend along the entire length of the intermediate portions of the group of signal conductors, or may extend along 90%, 70%, or 50% of the length of the intermediate portions of the group of signal conductors. This location, for example, may, if not welded, have a relatively large impact on crosstalk. Other gaps between edges and/or surfaces of the folded blank may be welded, but, in some examples, welding of these additional gaps may be omitted. Likewise, when the shell of the ground conductor is completed by multiple pieces of conductive material that are joined, gaps between separate pieces may be closed by welding. Accordingly, in some examples, gaps in the shell may be selectively closed by welding, providing both desired high-speed performance and efficient manufacture.

Each ground conductor may have one or more mounting contact surfaces. For example, a ground conductor may have two mounting contact surfaces on opposite sides of the pair of signal conductors in the group associated with the ground conductor. The mounting contact surfaces of the ground conductors may be in line, in the row direction, with the mounting ends of the pair of signal conductors and may have a shape similar to the shape of the mounting ends of the signal conductors of the pair. Such a configuration may enable the mounting ends of the ground conductors to be mounted to a PCB at the same time and using the same attachment technology as is used to mount the signal conductors. Both the signal and ground conductors, for example, may be mounted to a PCB using surface mount soldering.

The mounting contact surfaces may be disposed and shaped such that the mounting contact surfaces of the adjacent sides of two adjacent ground conductors can fit in a contact surface of another electrical component, such as a pad on a printed circuit board. The mounting contact surfaces of the ground conductors may be coplanar with the mounting contact surfaces of the signal conductors, which facilitates mounting the connector on this another electrical component, such as through surface mount soldering.

In some examples, the portions of the ground conductors that surround the signal conductors, forming a shell around the signal conductors, as well as the mating and mounting ends may be integrally formed, such as by stamping and forming a sheet of metal. The mating and mounting contact portions of the ground conductors may be integrally formed with the shell portion. Connector 100 is shown below with this construction.

The ground conductors may each include, for example, one or more contact bars, which may extend along the lengths of the mating ends of signal conductors. The contact bars may extend from the shell portion in a direction perpendicular to the row direction. In this configuration, a contact bar may be disposed between adjacent groups of signal conductors. Each contact bar may have a mating contact surface, configured for mating with a complementary mating contact surface of another electrical component, such as a complementary connector.

In other examples, the mating and/or mounting contact portions of the ground conductors may be on a separate component coupled to the shell portion. The ground conductor may have a shell portion that surrounds the intermediate portions of the signal conductors with one or more additional components joined to it. The mating and/or mounting contact portions may be formed as part of the additional components of the ground conductors attached to the shell portions. Connector 500 is shown below with this construction.

For example, the ground conductors for high-speed signals may include contact members in addition to the shell portion. The contact members may be similar to the signal conductors, with each contact member have a mating end comprising a mating contact surface, a mounting end opposite the mating end and comprising a mounting contact surface, and an intermediate portion extending therebetween.

The contact members may be electrically connected to the shells. The contact members may be mechanically joined to the shell as part of a subassembly or may be installed in a connector housing to make contact with one or more shells. In some embodiments, pairs of high-speed signal conductors may be mounted in a connector housing, side-by-side along a row. The contact members may be interspersed between the shells for the pairs. The intermediate portions of the contact members may have protrusions extending in the row direction to make contact with an adjacent shell. Contact members between two shells may have protrusions extending in opposite directions along the row such that each protrusion makes contact with both adjacent shells. In some embodiments, the contact members may be disposed such that broadsides of the contact members face adjacent shells. In an embodiment in which both the shells and the contact members have mounting contact surfaces, such a configuration may enable the adjacent shells and contact members to have their mounting contact surfaces engage the same contact surface of another electrical component, such as a pad on a printed circuit board.

In some embodiments, the row of conductive elements may include other conductive elements, which may be configured for low-speed signals, ground, power, or any other suitable purposes. In some embodiments, the row of conductive elements may be a first row of conductive elements. The electrical connector may include a second row of conductive elements. The high-speed and low-speed signal conductors, as well conductive elements configured for other purposes, may be distributed across the rows. The high-speed signal conductors, for example, may be only within a first row, for example.

The rows of signal conductors may be held within a connector housing to mate with complementary signal conductors in a mating connector. The design techniques described herein may be embodied as a receptacle connector.

In those embodiments, the first and second rows of conductive elements may be separated by a slot, which may be configured to receive a mating end of another electrical component, such as a printed circuit board or a plug connector. Alternatively or additionally, the design techniques described herein may be embodied as a plug connector. In those embodiments, the first and second rows of conductive elements may be held on opposite sides of a housing wall, which may be configured to insert into a slot of another electrical component, such as a card edge connector or a receptacle connector.

FIGS. 1A-1D are an example of techniques as described herein integrated into a plug connector. In this example, plug connector 100 may include a housing 102, which may include a base portion 114 that may elongate in a row direction, a front portion 108 extending from the base portion 114, and guide members 116 that may extend at opposite sides of the base portion 114. The guide members 116 may each include an opening 122 configured to receive a complementary guide member of a mating electrical component, and a slot 118 that may hold a fork lock 120. Fork lock 120 may be used to hold a mounting surface of the connector housing (shown in FIG. 1D) to a printed circuit board to which connector 100 is to be mounted.

The front portion 108 may include channels 110 shaped and disposed to receive respective conductive elements. The connector 100 may include a top row 104 of conductive elements and a bottom row 106 of conductive elements, separated from each other by the front portion 108 of the housing 102. As illustrated, the top row 104 of conductive elements may include conductive elements that may be shaped differently for various purposes including, for example, signal, ground, power, or any suitable purposes. Ground conductors, for example, may be longer than signal conductors. As another example, conductors designated for carrying power may be wider than those designated for carrying signal conductors. In this example, top row 104 contains only low-speed signal conductors.

Figure 2:
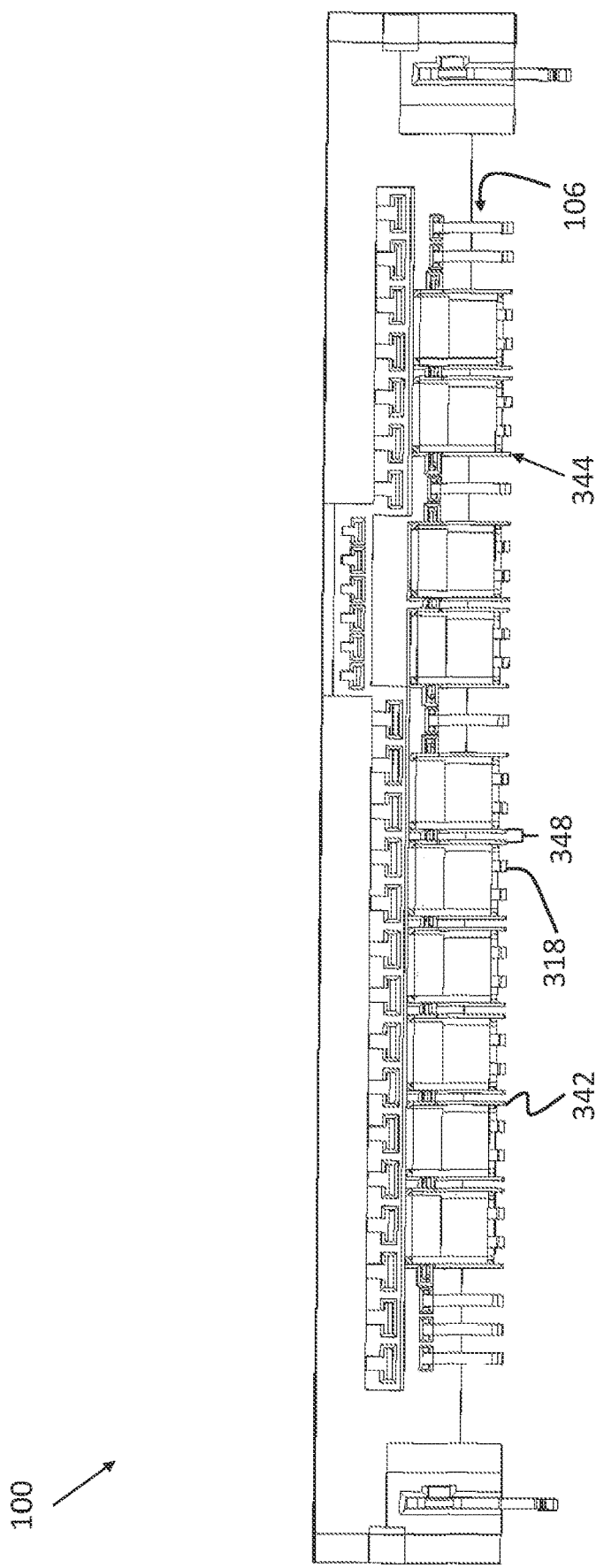
FIG. 2 is a rear perspective view of the plug connector of FIG. 1A, with the top row of conductive elements removed.

The bottom row 106 of conductive elements may also include conductive elements that may be shaped differently for various purposes including, for example, signal, ground, power, or any suitable purposes. Bottom row 106 contains groups of signal conductors configured for high-speed signals, here shown as pairs of signal conductors with associated ground conductors providing a shell around each group. In this example, each of the groups of signal conductors and its associated ground conductor may be formed as a subassembly 300. FIG. 2 shows a rear view of the plug connector 100, with the top row 104 of conductive elements removed and showing the bottom row 106 of conductive elements.

The connector 100 may include, in one or more rows, connector subassemblies configured to reduce crosstalk and enable high-speed transmission. In the illustrated example, the bottom row 106 of conductive elements includes connector subassemblies 300. Each connector subassembly 300 may include one or more features to engage a connector housing 102 such that each subassembly 300 may be inserted and then retained in housing 102. In this example, each subassembly 300 includes tabs 352 (shown in FIG. 4) on one or both sides of the first part 334 of the ground conductor 400. The tabs 352 may retain the subassemblies 300 within the housing.

Figure 3C:
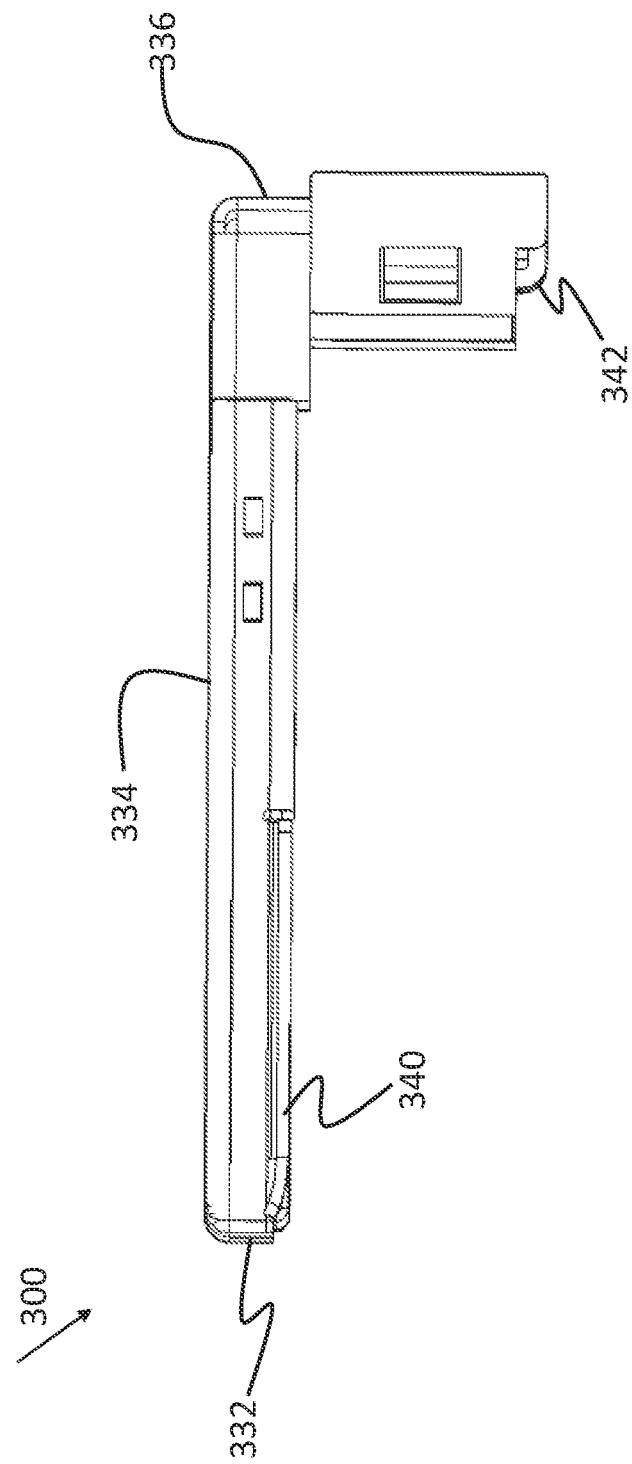
FIG. 3C is a side perspective view of the connector subassembly of FIG. 3A.

In the example illustrated in FIGS. 3A-3C, a connector subassembly 300 may include a pair of signal conductors 302 that may have broadsides 306 joined by edges 308, a housing member 304 holding the pair of signal conductors 302, and a ground conductor 400 substantially enclosing the pair of signal conductors 302. The pair of signal conductors 302 may each include a mating end 310 comprising a mating contact surface 312, a mounting end 316 opposite the mating end 310 and comprising a mounting contact surface 318, and an intermediate portion 314 extending between the mating end 310 and the mounting end 316. In the illustrated example, the mating contact surface 312 of the mating end 310 is substantially parallel to the mounting contact surface 318 of the mounting end 316. The pair of signal conductors each further includes a transition region between the intermediate portion 314 and the mating end 310, such that the mating contact surface 312 of the mating end 310 and the broadside 306 of the intermediate portion 314 extend along two planes that are offset from each other in a direction perpendicular to the broadside 306.

The housing member 304 may hold the pair of signal conductors 302 in an edge-to-edge configuration and separated from each other by a fixed center-to-center distance d1. The housing member 304 may include a first part 304A that may hold portions of the intermediate portions 314 of the pair of signal conductors 302, and a second part 304B that may hold portions of the mating ends of the pair of signal conductors 302. The portions of the intermediate portions 314 held by the housing member 304 may be along less than 50% of the lengths of the signal conductors 302, and in some embodiments, less than 40%, 30%, 20% or 10% of the lengths of the signal conductors 302. This configuration may reduce impedance variation along the lengths of the signal conductors 302. The first part 304A may have a recess 322 configured to engage with a mating feature of the ground conductor 400.

The ground conductor 400 may be configured with a shell that provides multi-dimensional shielding for the pair of signal conductors 302 and one or more contact members, here shown as contact bars 340, enabling the connector 100 to be compatible to physical requirements of corresponding industrial standards. Such a configuration enables high-speed transmission, without the need to redesign mating electrical components such as the peripherals that may be designed and manufactured by different companies according to a standard that specifies locations of the mating and mounting contact surfaces. As illustrated, the ground conductor 400 may extend from the mating ends 310 to the mounting ends 316 of the pair of signal conductors 302. The ground conductor 400 may have a front piece 332 disposed beyond the mating ends 310 of the pair of signal conductors 302. The ground conductor 400 may have an intermediate portion 326 surrounding the intermediate portions 314 of the pair of signal conductors 302. The intermediate portion 326 of the ground conductor 400 may have protrusions 324 configured to engage with the recess 322 of the housing member 304 when the pair of signal conductors 302 are disposed in position. The ground conductor may have an opening 328 that exposes the mating contact surfaces 312 of the pair of signal conductors 302, and an opening 330 that exposes that mounting contact surfaces 318 of the pair of signal conductors 302. In this example, the mating contact surfaces are exposed through an opening in the ground conductor that opens in a direction perpendicular to the elongated dimension of the signal conductors 302.

In the illustrated example, ground conductor 400 includes dimples 350 that align with signal conductors 302 adjacent first part 304A. Dimples 350 may reduce impedance variations along the length of the signal conductors 302.

The ground conductor 400 may include one or more parts. In the example shown in FIG. 4, the ground conductor 400 includes a first part 334 and a second part 336 configured to be attached to the first part 334 to form a shell substantially surrounding the pair of signal conductors 302. In this example, mating and mounting contact surfaces are integrally formed with the pieces that form the shell. The first part 334 may include mounting members 342 comprising mounting contact surfaces 344. The mounting contact surfaces 344 of the ground conductor 400 may be disposed in a same plane with the mounting contact surfaces 318 of the pair of signal conductors 302, such that the connector subassembly 300 can be mounted onto another electrical component such as a printed circuit board. Referring back to FIG. 2, a pair 348 of mounting members 342 of two adjacent ground conductors 400 may be sized and disposed such that their mounting contact surfaces 344 can fit in a contact surface of another electrical component such as one pad of a printed circuit board.

The pads on the printed circuit board may be positioned according to a predefined standard. For example, the pads in a row, such as pads for mounting high-speed signal conductors and their associated ground conductors may be on a uniform pitch. Enabling mounting contact surfaces of adjacent ground conductors to share a pad enables the techniques as described herein to be mounted on a PCB manufactured according to a standard for which pads for high-speed signal pairs are separated by a single ground pad. Nonetheless, the shells around the pairs provided by the ground conductors are grounded on both sides of the respective pairs, which enables the connector to carry high-speed signals.

Accordingly, within a region of a connector with high-speed signal conductors in a row, the pairs 348 of mounting members 342 and mounting contact surface 318 may be on a uniform center-to-center pitch. For example, the center-to-center pitch may be 0.80 mm in some embodiments. Moreover, the pads span a distance, in the row direction, that is a fraction of the center-to-center pitch. For example, the pads may have a width of 0.5 mm. The mounting members 342 of two adjacent ground conductors 400 that are to be mounted to the same pad may span a distance in the row direction that is less than this fraction of the center-to-center pitch. For example, each of the pairs 348 of mounting members 342 may span a distance, in the row direction, that is 85% or less than this fraction of the center-to-center pitch in some examples, of 80% or less, or 75% or less, or 70% or less in some examples.

As shown in FIGS. 3A-4, the first part 334 may include a contact bar 340 having a mating contact surface 346. The contact bar 340 may extend from a side of the opening 328 and along the lengths of the mating ends 310 of the pair of signal conductors 302. The opening 328 and the contact bar 340 may be sized and disposed to control a center-to-center distance d2 between the contact bar 340 and an adjacent mating end 310. In some embodiments, the center-to-center distance d2 between the contact bar 340 and an adjacent mating end 310 may be configured to be the same as the center-to-center distance d1 between the mating ends 310 of the pair of signal conductors 302. Such a design enables the control of the distances d1 and d2 according to the applicable industrial standards. Although the first part 334 of ground conductor 400 illustrated in FIG. 4 has a contact bar 340 on one side of the opening 328, a ground conductor 400 may have contact bars 340 on both sides of the opening 328.

As discussed above, the first part 334 may be formed by stamping a metal sheet into a one-piece blank. The one-piece blank may be folded into the shape illustrated in FIG. 4. A gap, however, would exist between edges of the one-piece blank. The inventors have recognized and appreciated that filling the gap by, for example, forming a weld 338 between the edges of the one-piece blank cuts off this path and reduces interference to another pair of signal conductors as a result of cross talk from the pair of signal conductors 302.

The addition of the second part 336 may extend the multi-dimensional shielding that may be provided by the first part 334. As illustrated, the pair of the signal conductors 302 may each be substantially L-shaped. The pair of the signal conductors 302 may be inserted into the first part 334 of the ground conductor 400 until the protrusions 324 of the ground conductor 400 engage with the recess 322 of the housing member 304. The second part 336 may be attached to the first part 334, forming an enclosure with portions of the first part 334 for bend portions of the L-shaped signal conductors 302.

Techniques as described herein may also be embodied as receptacle connectors. Receptacle connector 500 here is shown in a configuration that it may mate with a plug connector 100. Accordingly, while the mating contact portions of the conductive elements of connector 100 were blade like, the mating contact portions of connector 500 have a complementary configuration, here illustrated as beams that deflect upon mating to generate a contact force.

Figure 5A:
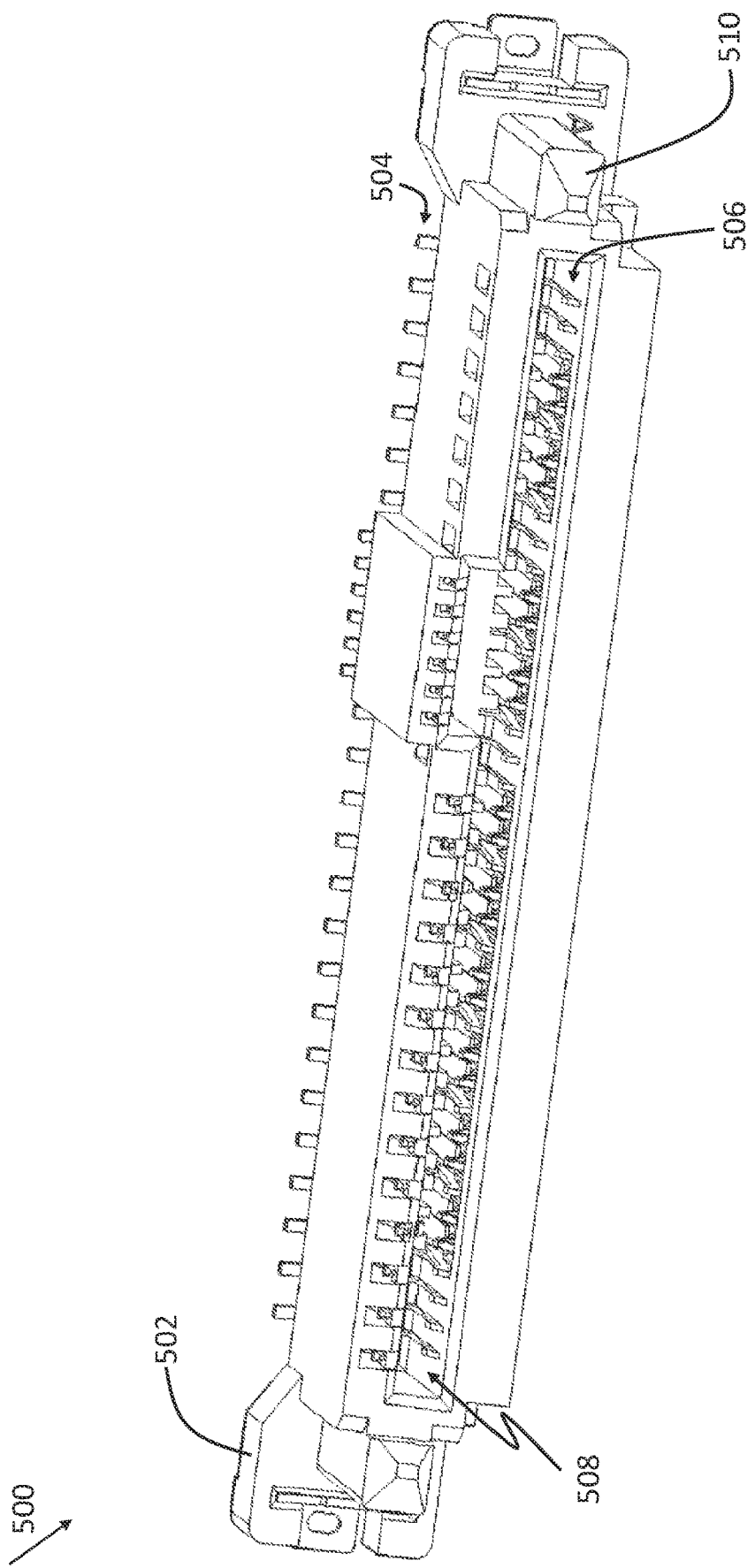
FIG. 5A is a perspective view of a receptacle connector, showing a mating interface, according to some embodiments.
Figure 5B:
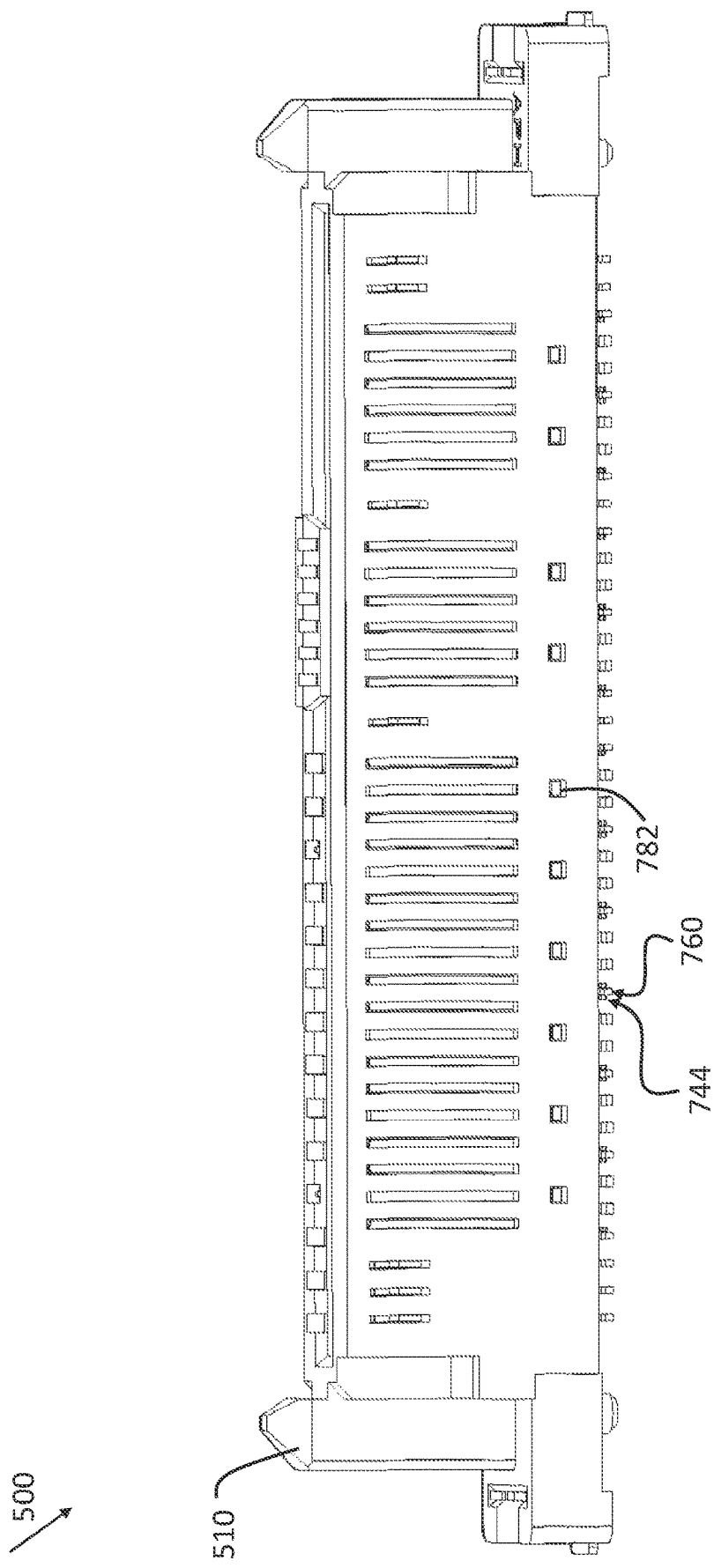
FIG. 5B is another perspective view of the receptacle connector of FIG. 5A.
Figure 5C:
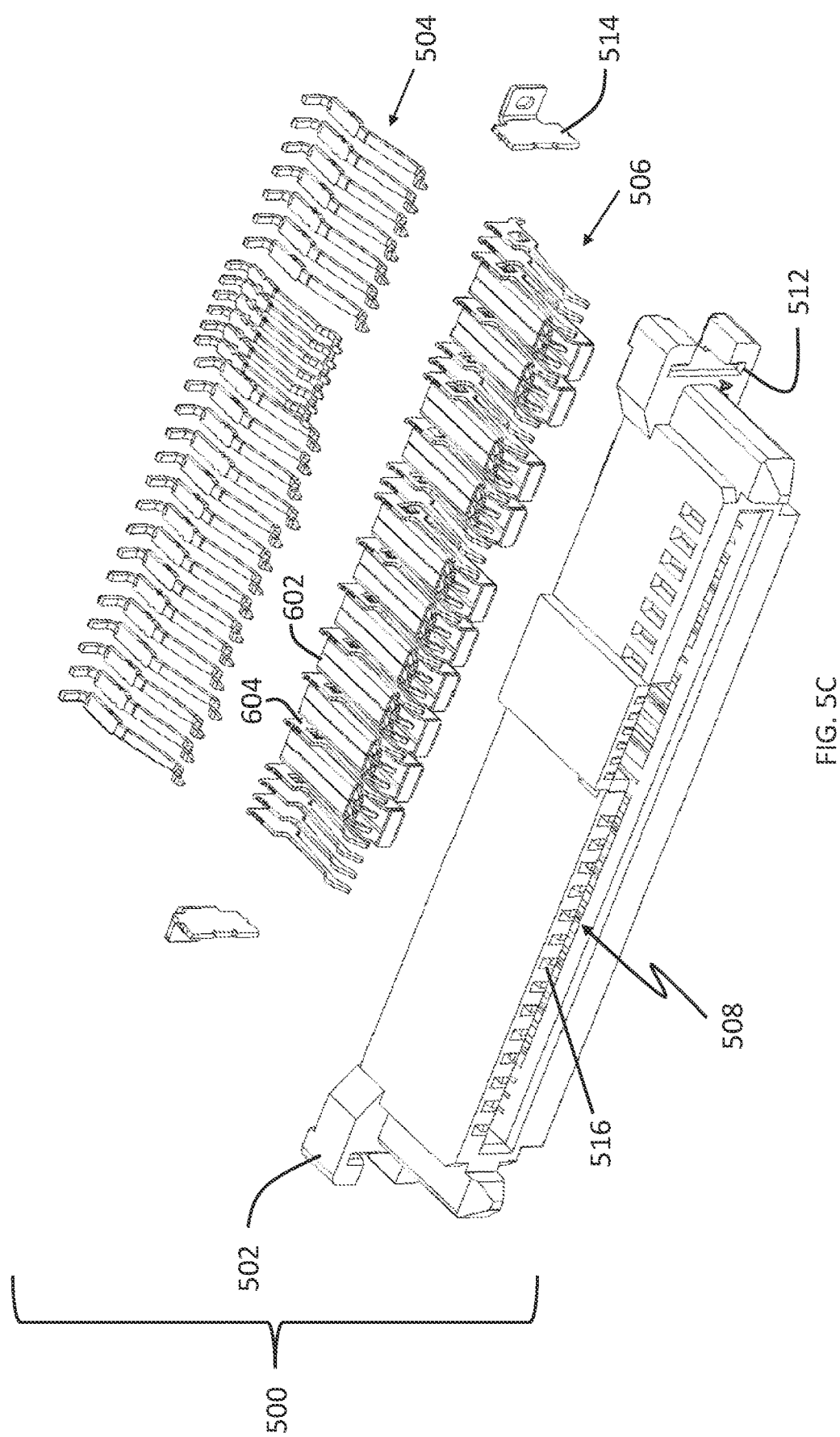
FIG. 5C is a partially exploded view of the receptacle connector of FIG. 5A.

As shown in FIGS. 5A-5C, a receptacle connector 500 may include a housing 502, which may have a slot 508, elongated in a row direction. Housing 502 may also include guide members 510 that may extend at opposite sides of the slots 508. The guide members 510 may be configured to engage complementary guide members of another electrical component (e.g., the openings 122 of the guide members 116 of the plug connector 100). The housing 502 may also include slots 512 on opposite sides with locking member 514 inserted in the slots 512. Locking members 514 may be configured to enhance the attachment between the receptacle connector 500 and another electrical component that the receptacle connector 500 is mounted to, such as a printed circuit board. The housing 502 may include channels 516 shaped and disposed to receive respective conductive elements.

The connector 500 may include a top row 504 of conductive elements and a bottom row 506 of conductive elements, separated from each other by the slot 508 of the housing 502. As illustrated, the top row 504 of conductive elements may include conductive elements that may be shaped differently for various purposes including, for example, signal, ground, power, or any suitable purposes. The bottom row 506 of conductive elements may also include conductive elements that may be shaped differently for various purposes including, for example, low-speed signal, ground, power, or any suitable purposes.

The connector 500 may include, in one or more rows, connector subassemblies 602 configured to reduce crosstalk and enable high-speed transmissions. The subassemblies may include engagement features, such as tabs 782, to retain the subassemblies when inserted into openings of a connector housing. In the illustrated example, the bottom row 506 of conductive elements includes connector subassemblies 602, each of which includes a group of signal conductors and an associated ground conductor. As with the example of connector 100, the groups of signal conductors are pairs. Also as with the example of connector 100, each ground conductor includes a shell, mating and mounting contact surfaces. In this example, shell 606 is formed separately from contact member 604. Each shell 606 may be electrically connected, in an assembled connector, to one or more contact members 604.

Figure 7C:
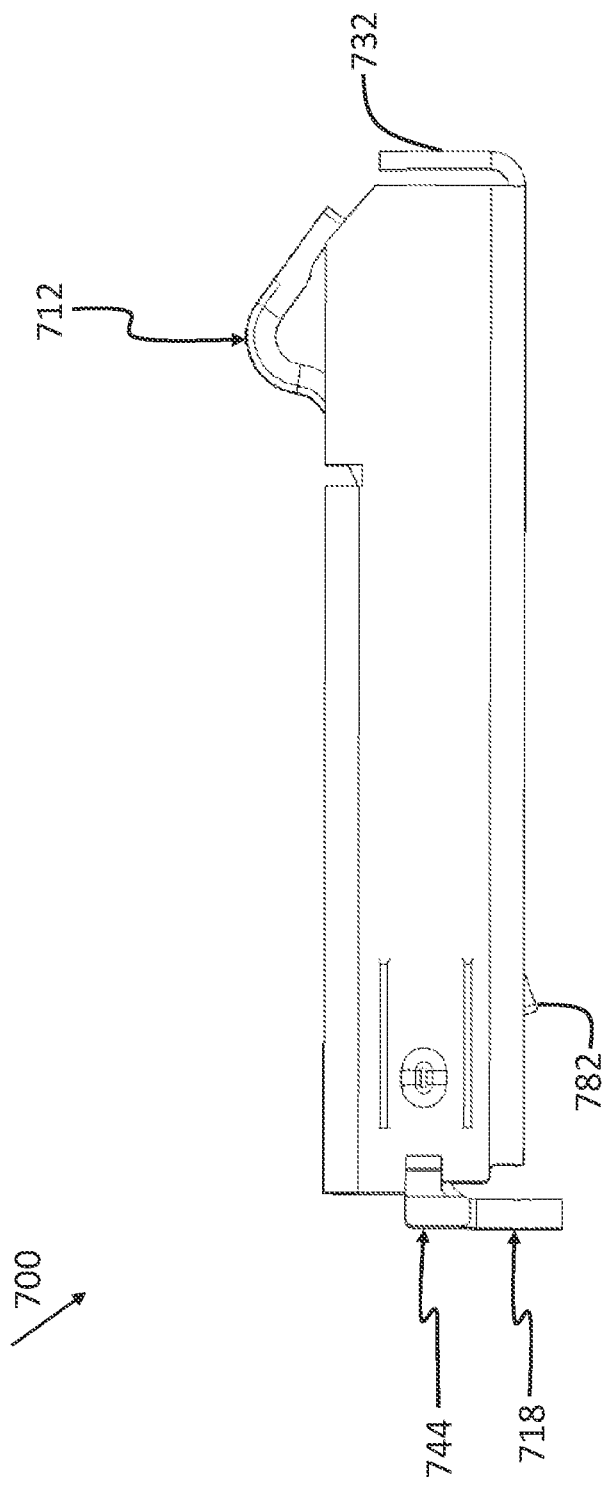
FIG. 7C is a side perspective view of the connector subassembly of FIG. 7A, with a ground conductive element removed.

As illustrated in FIGS. 6-7B, a connector subassembly 602 may include a pair of signal conductors 702 that may have broadsides 706 joined by edges 706, a housing member 704 holding the pair of signal conductors 704, and a shell 606 substantially enclosing the pair of signal conductors 702. The pair of signal conductors 702 may each include a mating end 710 comprising a mating contact surface 712, a mounting end 716 opposite the mating end 710 and comprising a mounting contact surface 718, and an intermediate portion 714 extending between the mating end 710 and the mounting end 716. The mounting ends 710 may curve into the slot 508 of the housing 502. The mating contact surface 712 may be substantially perpendicular to the mounting contact surface 718.

The housing member 704 may hold the pair of signal conductors 702 in an edge-to-edge configuration and separated from each other by a fixed center-to-center distance d3. The housing member 704 may hold portions of the intermediate portions 714 of the pair of signal conductors 702. The portions of the intermediate portions 714 held by the housing member may be along less than 50% of the lengths of the signal conductors 702, and in some embodiments, less than 40%, 30%, 20% or 10% of the lengths of the signal conductors 702. This configuration may reduce impedance imbalance along the lengths of the signal conductors 702.

The shell 606 may be configured to provide multi-dimensional shielding for the pair of signal conductors 702, while enabling the connector 500 to be compatible to physical requirements of corresponding industrial standards. As illustrated, the shell 606 may extend from the mating ends 710 to the mounting ends 716 of the pair of signal conductors 702. The shell 606 may include an opening 746 that exposes the mating ends 710 of the pair of signal conductors 702. The shell 606 may have a front piece 732 disposed beyond the mating ends 710 of the pair of signal conductors 702. The shell 606 may have an intermediate portion 726 surrounding the intermediate portions 714 of the pair of signal conductors 702. The intermediate portion 726 may have recesses 750 on opposite sides. As discussed above, the shell 606 may include a weld 748 that fills in a gap between edges resulting from folding a one-piece blank into a tubular structure by joining opposing edges of the blank. The weld 748 may extend substantially along the length of the intermediate portion of the shell 606 and of the signal conductors 702 within the shell. The shell 606 may include mounting members 742 comprising mounting contact surfaces 744. The mounting contact surfaces 744 of the shell 606 may be disposed in a same plane with the mounting contact surfaces 718 of the pair of signal conductors 702, such that the connector subassembly 602 can be mounted onto another electrical component such as a printed circuit board. The mounting contact surfaces 744 may also align, in the row direction, with the mounting contact surfaces 718 of the pair of signal conductors 702.

The contact member 604 may be configured to electrically connect to one or more adjacent shells 606, while enabling the connector 500 to be compatible to physical requirements of corresponding industrial standards. The contact member 604 may include a mating end 752 comprising a mating contact surface 758, a mounting end 754 opposite the mating end 752 and comprising a mounting contact surface 760, and an intermediate portion 756 extending between the mating end 752 and the mounting end 754. The contact member 604 may be disposed to have its broadside 762 facing an adjacent shell 606. The intermediate portion 756 of the contact member 604 may include one or more protrusions 764 to make contact with an adjacent shell. In this example, contact members 604 between two shells may have two protrusions 764 extending in opposite directions for making contact with both adjacent shells. Each protrusion 764 may be configured to engage a recess 750 of an adjacent shell 606.

Housing 502, connector subassembly 602, and the contact member 604 may be configured to provide a center-to-center distance d4 between the mating end 752 of the contact member 604 and a mating end 710 of an adjacent signal conductor 702. Such a design enables the control of the distances d3 and d4 according to the applicable industrial standards. Referring back to FIG. 5B, the mounting contact surface 760 of the contact member 604 may be sized and disposed such that it can fit in a contact surface of another electrical component such as one pad of a printed circuit board together with mounting contact surfaces 744 of two adjacent shells 606. It should be appreciated that FIG. 5B is a perspective view. The mounting surfaces 760 and 744 may be aligned in a plane, such that both mounting surfaces 760 and 744 may be surface mount soldered to a pad on a PCB. However, in other examples, only one of mounting surfaces 760 or 744 may be soldered to the PCB pad such that mounting surfaces 760 and 744 may be in different planes.

Techniques as described herein may be embodied in card edge connectors or connectors configured only for high-speed signals. FIGS. 8A-8B illustrate a card edge connector 800. The card edge connector 800 may include a housing 802 and one or more rows of conductive elements held by the housing 802. The card edge connector 800 may include, in one or more rows, connector subassemblies 804, with contact members 806 on each side of each subassembly 804. The connector subassemblies 804 may be constructed similar to the connector subassemblies 602 of the receptacle connector 500. The contact members 806 may be constructed similar to the contact members 604 of the receptacle connector 500.

Figure 9B:
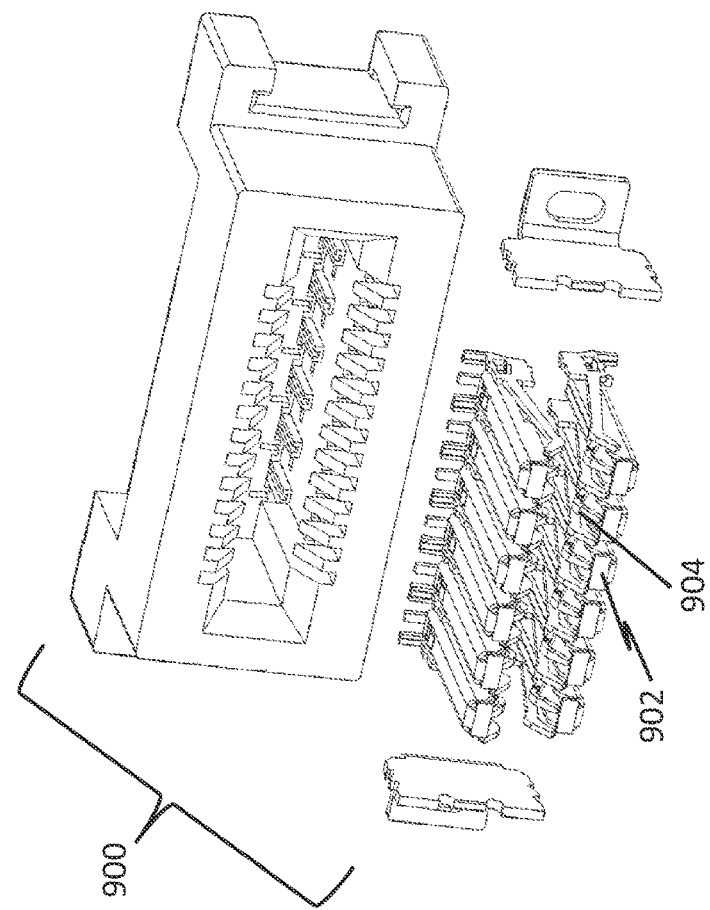
FIG. 9B is a partially exploded view of the card edge connector of FIG. 9A.
Figure 9A:
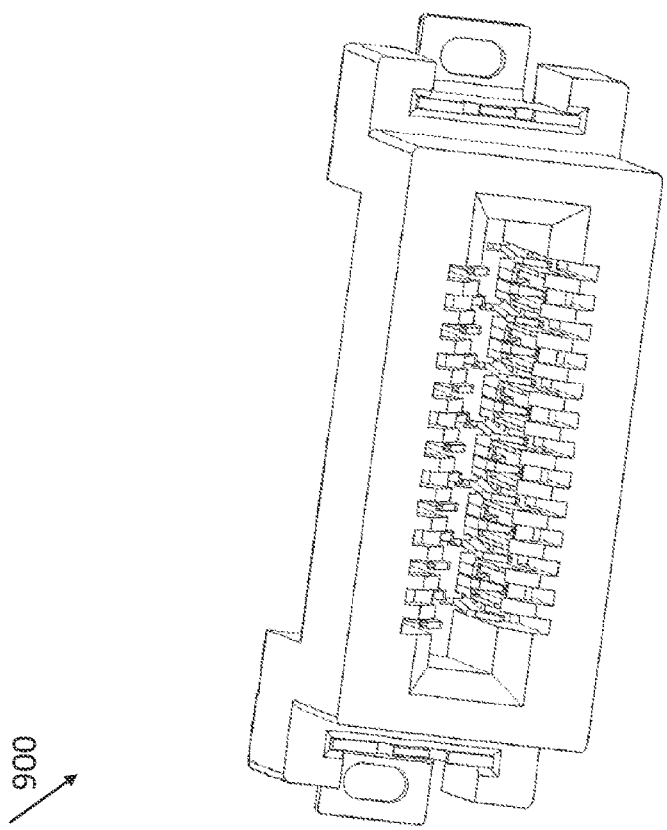
FIG. 9A is a perspective view of a card edge connector, according to some embodiments.

One or more signal conductors may be grouped to be shielded multi-dimensionally by a ground conductor. Aspects of the present disclosure should not be limited to the number of signal conductors in a group. FIG. 9A-9B illustrate a card edge connector 900, which has ground conductors 902 providing multi-dimensional shielding for individual signal conductors 904. In some embodiments, a ground conductor may provide multi-dimensional shielding for more or less than two signal conductors. In some embodiments, a connector may include connector subassemblies of different configurations. A first connector subassembly of the multiple connector subassemblies may include a ground conductor providing multi-dimensional shielding for a single signal conductor. A second connector subassembly of the multiple connector subassemblies may include a ground conductor providing multi-dimensional shielding for a pair of signal conductors.

In some embodiments, housing components, such as the housing 102 and housing members 304A and 304B, may be dielectric members molded from a dielectric material such as plastic or nylon. Examples of suitable materials include, but are not limited to, liquid crystal polymer (LCP), polyphenyline sulfide (PPS), high temperature nylon or polyphenylenoxide (PPO) or polypropylene (PP). Other suitable materials may be employed, as aspects of the present disclosure are not limited in this regard.

In some embodiments, conductive elements such as signal conductors 302 may be made of metal or any other material that is conductive and provides suitable mechanical properties for conductive elements in an electrical connector. Phosphor-bronze, beryllium copper and other copper alloys are non-limiting examples of materials that may be used.

The conductive elements may be formed from such materials in any suitable way, including by stamping and/or forming.

Although details of specific configurations of conductive elements and housings are described above, it should be appreciated that such details are provided solely for purposes of illustration, as the concepts disclosed herein are capable of other manners of implementation. In that respect, various connector designs described herein may be used in any suitable combination, as aspects of the present disclosure are not limited to the particular combinations shown in the drawings.

Having thus described several embodiments, it is to be appreciated various alterations, modifications, and improvements may readily occur to those skilled in the art.

For example, high-speed and low-speed signal conductors may be configured the same, with signal conductors in the same row having the same shape. The high-speed and low-speed signal conductors nonetheless may be differentiated based on the ground structures and insulative portions around them. Alternatively, some or all of the high-speed signal conductors may be configured differently from low-speed signal conductors, even within the same row. The edge-to-edge spacing may be closer for high-speed signal conductors, for example.

Embodiments were illustrated in which the ground conductors include a shell portion and a separate contact member. Both the shell and the contact member may have one or more mounting contact portions. In other examples, however, only one of the shell and the contact member may include mounting contact portions.

Further, an example was provided of a connector with ground conductors for high-speed signals with a contact member integral with and extending from a shell. An example was provided of such contact members with contact portions shaped as blades. Alternatively or additionally, contact members integral with and extending from a shell may have contact portions shaped as beams. Similarly, contact members shaped as compliant beams formed separately from the shell were illustrated. Alternatively or additionally, separate contact members may have mating ends shaped as blades.

As another example, connectors are illustrated that have mating locations and mounting locations that may be compatible with a PCIeSAS standard. Techniques as described herein may be used to increase the operating speed of connectors designed according to other standards.

As yet another example, a plug connector was illustrated with mating contact portions of a first configuration and a receptacle connector was illustrated with mating contact portions with a second, complementary structures. A plug connector and receptacle connector may, in other examples, have the configurations of the mating contact portions reversed, or mixed.

Such alterations, modifications, and improvements are intended to be within the spirit and scope of the invention. Accordingly, the foregoing description and drawings are by way of example only.

Furthermore, techniques for increasing the operating speed of a connector, even when constrained by dimensions specified in an industry standard, are shown and described with reference to a plug connector having a parallel board configuration, a receptacle connector, and card edge connectors, it should be appreciated that aspects of the present disclosure are not limited in this regard, as any of the inventive concepts, whether alone or in combination with one or more other inventive concepts, may be used in other types of electrical connectors, such as backplane connectors, right angle connectors, stacking connectors, mezzanine connectors, I/O connectors, chip sockets, etc.

In some embodiments, mounting ends were illustrated as surface mount elements that are designed to fit within pads of printed circuit boards. However, other configurations may also be used, such as press fit "eye of the needle" compliant sections, spring contacts, solderable pins, etc.

All definitions, as defined and used, should be understood to control over dictionary definitions, definitions in documents incorporated by reference, and/or ordinary meanings of the defined terms.

Numerical values and ranges may be described in the specification and claims as approximate or exact values or ranges. For example, in some cases the terms "about," "approximately," and "substantially" may be used in reference to a value. Such references are intended to encompass the referenced value as well as plus and minus reasonable variations of the value.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. An electrical connector comprising:
a housing;
a plurality of signal conductors coupled to the housing and disposed in a plurality of groups of signal conductors, each of the signal conductors comprising a mating end, a mounting end and an intermediate portion joining the mating end and the mounting end, wherein the mating ends of the plurality of signal conductors are disposed in a row; and
a plurality of ground conductors associated with respective groups of the plurality of groups of signal conductors, each of the plurality of ground conductors comprising a shell and a contact member, wherein,
for each of the plurality of ground conductors:
the shell comprises a first opening and a second opening,
the contact member comprises a mating end,
the intermediate portions of the signal conductors of the respective group of signal conductors are disposed within the shell such that the mating ends are exposed through the first opening and the mounting ends are exposed through the second opening, and
the mating end of the contact member is disposed within the row of mating ends of the plurality of signal conductors.

2. The electrical connector of claim 1, wherein:
the shell comprises a mating end adjacent the mating ends of the respective group of signal conductors,
the mating end of the shell comprises a plurality of side portions surrounding the mating ends of the respective group of signal conductors on three sides and an end portion orthogonal to the plurality of side portions, and the first opening of the shell is through a side of the shell that is orthogonal to the end portion.

3. The electrical connector of claim 1, wherein:

the shell comprises at least one metal sheet with a first edge and a second edge, and the metal sheet is folded such that the first edge and the second edge face each other.

4. The electrical connector of claim 3, wherein:

the first edge and the second edge are joined at a weld.

5. The electrical connector of claim 1, wherein:

the shell comprises a metal component, and the contact member is integral with the metal component.

6. The electrical connector of claim 5, wherein:

the mating end of the contact member and the mating ends of the plurality of signal conductors are blades.

7. The electrical connector of claim 1, wherein:

the contact member is formed separately from the shell.

8. The electrical connector of claim 7, wherein:

the mating end of the contact member and the mating ends of the plurality of signal conductors are compliant beams.

9. An electrical connector, comprising:

a housing;

a plurality of signal conductors coupled to the housing and disposed in a plurality of groups of signal conductors, each of the signal conductors comprising a mating end, a mounting end and an intermediate portion joining the mating end and the mounting end, wherein the mounting ends of the plurality of signal conductors are disposed in a row;

a plurality of ground conductors associated with respective groups of the plurality of groups of signal conductors, each of the plurality of ground conductors comprising a shell and a contact member, wherein, for each of the plurality of ground conductors:

the shell comprises a first opening and a second opening, the intermediate portions of the signal conductors of the respective group of signal conductors are disposed within the shell such that the mating ends are exposed through the first opening and the mounting ends are exposed through the second opening, and the plurality of ground conductors comprise a plurality of mounting members disposed in the row such that a mounting member of a ground conductor is disposed adjacent to and on each side of the mounting ends of the signal conductors of each of the plurality of groups.

10. The electrical connector of claim 9, wherein:

the mounting ends of the signal conductors of each of the plurality of groups have a center-to-center separation of a first distance, and the mounting members of the ground conductors have a center-to-center separation with respect to adjacent mounting ends of the signal conductors of the first distance, and mounting members of the plurality of ground conductors disposed between and adjacent to two of the plurality of groups are electrically coupled to the shells of the respective ground conductors of the two groups.

11. The electrical connector of claim 9, wherein:

the plurality of mounting members of the plurality of ground conductors comprise mounting tabs integral with the shells of the ground conductors.

12. The electrical connector of claim 9, wherein:

the plurality of ground conductors each comprises a contact member electrically coupled to the shell, and each of the plurality of mounting members of the plurality of ground conductors comprises a mounting tab integral with a contact member of a ground conductor.

13. The electrical connector of claim 9, wherein:

the mounting ends of the plurality of signal conductors and the mounting members of the plurality of ground conductors are disposed in a linear array, the linear array comprising a repeating pattern of one mounting member of a ground conductor followed by two mounting ends of signal conductors; and one mounting member of a ground conductor following the repeating pattern.

14. An electronic system comprising:

a printed circuit board; and the electrical connector of claim 9 mounted to the printed circuit board, wherein:

the printed circuit board comprises a surface with a linear array of contact pads on the surface, the linear array of contact pads comprising:

a repeating pattern of one ground pad followed by two differential signal pads; and a ground pad following the repeating pattern;

the linear array of the electrical connector is aligned with the linear array of the printed circuit board; and the mounting ends of the plurality of signal conductors and the mounting members of the plurality of ground conductors in the linear array of the electrical connector are soldered to respective pads in the linear array of the printed circuit board.

15. An electrical connector subassembly, comprising:

at least one signal conductor, the at least one signal conductor each comprising a mating end comprising a mating contact surface, a mounting end opposite the mating end and comprising a mounting contact surface, and an intermediate portion extending between the mating end and the mounting end;

a housing member holding a portion of the intermediate portion of the at least one signal conductor; and a ground conductor surrounding the intermediate portion of the at least one signal conductor, the ground conductor comprising a mounting contact surface disposed in a same plane with the mounting contact surface of the at least one signal conductor.

16. The electrical connector subassembly of claim 15, wherein:

the ground conductor extends to the mating end of the at least one signal conductor, and comprises an opening that exposes the mating contact surface of the at least one signal conductor.

17. The electrical connector subassembly of claim 16, wherein:

the ground conductor comprises a front piece at a side of the opening.

18. The electrical connector subassembly of claim 16, wherein:

the ground conductor comprises a contact bar extending from the opening.

19. The electrical connector subassembly of claim 15, wherein:

the ground conductor comprises a weld extending along the intermediate portion of the at least one signal conductor.

20. The electrical connector subassembly of claim 19, wherein:

the weld extends to the mating end of the at least one signal conductor.

* * * * *